United States Patent
Miyamoto

(10) Patent No.: US 11,837,839 B2
(45) Date of Patent: Dec. 5, 2023

(54) OPTICAL PULSE STRETCHER, LASER DEVICE, AND ELECTRONIC DEVICE MANUFACTURING METHOD

(71) Applicant: Gigaphoton Inc., Tochigi (JP)

(72) Inventor: Hirotaka Miyamoto, Oyama (JP)

(73) Assignee: Gigaphoton Inc., Tochigi (JP)

( * ) Notice: Subject to any disclaimer, the term of this patent is extended or adjusted under 35 U.S.C. 154(b) by 81 days.

(21) Appl. No.: 17/572,185

(22) Filed: Jan. 10, 2022

(65) Prior Publication Data
US 2022/0131328 A1 Apr. 28, 2022

Related U.S. Application Data

(63) Continuation of application No. PCT/JP2019/031233, filed on Aug. 7, 2019.

(51) Int. Cl.
*H01S 3/00* (2006.01)
*G02B 17/02* (2006.01)
*G02B 17/06* (2006.01)
*G03F 7/00* (2006.01)
*H01S 3/23* (2006.01)

(52) U.S. Cl.
CPC .......... *H01S 3/0057* (2013.01); *G02B 17/023* (2013.01); *G02B 17/0657* (2013.01); *G03F 7/70191* (2013.01); *H01S 3/0014* (2013.01); *H01S 3/2308* (2013.01)

(58) Field of Classification Search
CPC .... H01S 3/0057; H01S 3/0014; H01S 3/2308; G02B 17/023; G02B 17/0657; G03F 7/70191
See application file for complete search history.

(56) References Cited

U.S. PATENT DOCUMENTS 6,549,267 B1 4/2003 Kudo
7,778,302 B2 8/2010 Ershov et al.
7,822,092 B2 10/2010 Ershov et al.
7,999,915 B2 8/2011 Ershov et al.
(Continued)

FOREIGN PATENT DOCUMENTS

JP H09-288251 A 11/1997
JP 2009-076906 A 4/2009
(Continued)

OTHER PUBLICATIONS

International Search Report issued in PCT/JP2019/031233; dated Nov. 5, 2019.
(Continued)

*Primary Examiner* — Hung V Nguyen
*Assistant Examiner* — Hung Henry Nguyen
(74) *Attorney, Agent, or Firm* — Studebaker & Brackett PC

(57) ABSTRACT

An optical pulse stretcher includes a first delay optical system including a plurality of concave toroidal mirrors; and a beam splitter including a first surface and a second surface, causing a part of pulse laser light incident on the first surface to be transmitted in a first direction and output as a first beam and another part thereof to be reflected in a second direction and enter the first delay optical system, and causing a part of pulse laser light incident on the second surface from the first delay optical system to be reflected in the first direction and output as a second beam.

12 Claims, 16 Drawing Sheets

(56) References Cited

U.S. PATENT DOCUMENTS

| | | |
|---|---|---|
| 9,711,934 B2 * | 7/2017 | Wakabayashi .......... H01S 3/139 |
| 9,927,297 B2 * | 3/2018 | Kawata ................. G01J 3/0229 |
| 11,025,026 B2 * | 6/2021 | Onose ................... H01S 3/1003 |
| 2009/0052480 A1 | 2/2009 | Cobb et al. |
| 2009/0080476 A1 | 3/2009 | Partlo et al. |
| 2009/0080478 A1 | 3/2009 | Burkert et al. |
| 2016/0248219 A1 | 8/2016 | Wakabayashi et al. |
| 2018/0254600 A1 | 9/2018 | Kumazaki et al. |
| 2019/0103724 A1 | 4/2019 | Onose et al. |
| 2021/0016390 A1 * | 1/2021 | Ashikawa ............. H01S 3/0057 |

FOREIGN PATENT DOCUMENTS

| | | |
|---|---|---|
| WO | 2007/141185 A2 | 12/2007 |
| WO | 2015/092855 A1 | 6/2015 |
| WO | 2018/020564 A1 | 2/2018 |

OTHER PUBLICATIONS

International Preliminary Report on Patentability and Written Opinion issued in PCT/JP2019/031233; dated Feb. 8, 2022.

\* cited by examiner

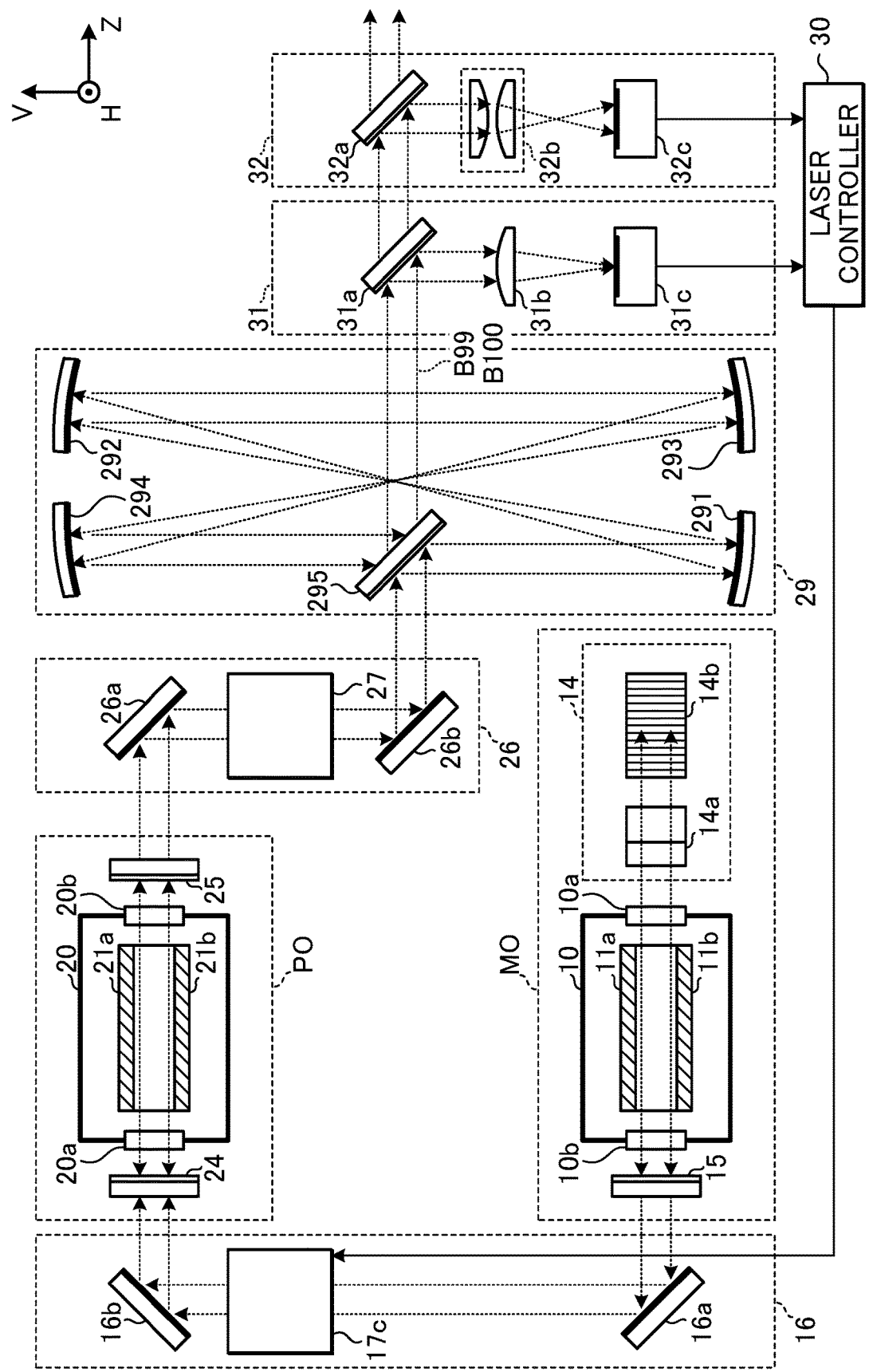

US 11,837,839 B2

OPTICAL PULSE STRETCHER, LASER DEVICE, AND ELECTRONIC DEVICE MANUFACTURING METHOD

CROSS-REFERENCE TO RELATED APPLICATIONS

The present application claims the benefit of International Application No. PCT/JP2019/031233, filed on Aug. 7, 2019, the entire contents of which are hereby incorporated by reference.

BACKGROUND

1. Technical Field

The present disclosure relates to an optical pulse stretcher, a laser device, and an electronic device manufacturing method.

2. Related Art

Improvement in resolution of a semiconductor exposure apparatus has been desired for miniaturization and high integration of semiconductor integrated circuits. Hereinafter, a semiconductor exposure apparatus is simply referred to as an "exposure apparatus." For this purpose, an exposure light source that outputs light having a shorter wavelength has been developed. As the exposure light source, a gas laser apparatus is used in place of a conventional mercury lamp. As a gas laser apparatus for exposure, a KrF excimer laser apparatus that outputs ultraviolet light having a wavelength of 248 nm and an ArF excimer laser apparatus that outputs ultraviolet light having a wavelength of 193 nm are currently used.

As current exposure technology, immersion exposure is practically used in which a gap between a projection lens of an exposure apparatus and a wafer is filled with a liquid and a refractive index of the gap is changed to reduce an apparent wavelength of light from an exposure light source. When the immersion exposure is performed using the ArF excimer laser apparatus as the exposure light source, the wafer is irradiated with ultraviolet light having a wavelength of 134 nm in water. This technology is referred to as ArF immersion exposure. The ArF immersion exposure is also referred to as ArF immersion lithography.

Since the KrF excimer laser apparatus and the ArF excimer laser apparatus have a large spectral line width of about 350 to 400 pm in natural oscillation, chromatic aberration of laser light (ultraviolet light), which is reduced and projected on a wafer by a projection lens of an exposure apparatus, occurs to deteriorate resolution. Then, a spectral line width of laser light output from the gas laser apparatus needs to be narrowed to the extent that the chromatic aberration can be ignored. The spectral line width is also referred to as a spectral width. For this purpose, a line narrowing module (LNM) having a line narrowing element is provided in a laser resonator of the gas laser apparatus to narrow the spectral width. The line narrowing element may be an etalon, a grating, or the like. A laser apparatus with such a narrowed spectral width is referred to as a line narrowing laser apparatus.

LIST OF DOCUMENTS

Patent Documents

Patent Document 1: U.S. Pat. No. 7,822,092
Patent Document 2: U.S. Pat. No. 7,999,915
Patent Document 3: U.S. Pat. No. 7,778,302
Patent Document 4: US Patent Application Publication No. 2016/0248219
Patent Document 5: US Patent Application Publication No. 2018/0254600

SUMMARY

An optical pulse stretcher according to an aspect of the present disclosure may include a first delay optical system including a plurality of concave toroidal mirrors; and a beam splitter including a first surface and a second surface, causing a part of pulse laser light incident on the first surface to be transmitted in a first direction and output as a first beam and another part thereof to be reflected in a second direction and enter the first delay optical system, and causing a part of pulse laser light incident on the second surface from the first delay optical system to be reflected in the first direction and output as a second beam.

A laser device according to an aspect of the present disclosure may include a master oscillator configured to output pulse laser light; and a first optical pulse stretcher which includes a first delay optical system including a plurality of concave toroidal mirrors, and a beam splitter including a first surface and a second surface, causing a part of pulse laser light incident on the first surface to be transmitted in a first direction and output as a first beam and another part thereof to be reflected in a second direction and enter the first delay optical system, and causing a part of pulse laser light incident on the second surface from the first delay optical system to be reflected in the first direction and output as a second beam, and which is arranged on an optical path of pulse laser light output from the master oscillator.

An electronic device manufacturing method according to an aspect of the present disclosure may include generating pulse laser light using a laser device, emitting the pulse laser light to an exposure apparatus, and exposing a photosensitive substrate to the pulse laser light in the exposure apparatus to manufacture an electronic device. Here, the laser device includes a master oscillator configured to output pulse laser light; and a first optical pulse stretcher which includes a first delay optical system including a plurality of concave toroidal mirrors, and a beam splitter including a first surface and a second surface, causing a part of pulse laser light incident on the first surface to be transmitted in a first direction and output as a first beam and another part thereof to be reflected in a second direction and enter the first delay optical system, and causing a part of pulse laser light incident on the second surface from the first delay optical system to be reflected in the first direction and output as a second beam, and which is arranged on an optical path of pulse laser light output from the master oscillator.

BRIEF DESCRIPTION OF THE DRAWINGS

Embodiments of the present disclosure will be described below merely as examples with reference to the accompanying drawings.

FIG. 10 schematically shows the configuration of the laser device of a fourth embodiment of the present disclosure.

DESCRIPTION OF EMBODIMENTS

Figure 1:
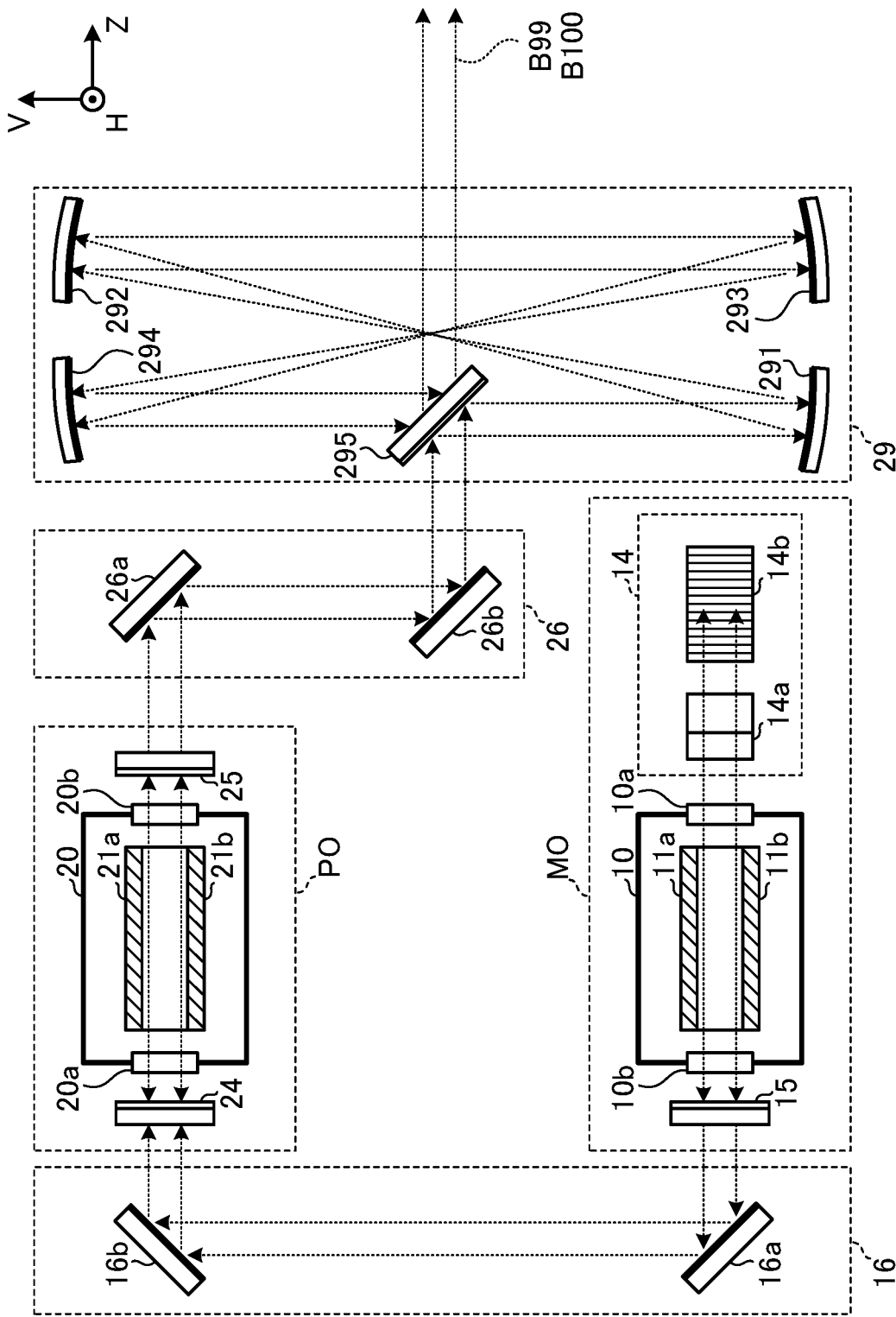
FIG. 1 schematically shows the configuration of a laser device according to a comparative example.

<Contents>
1. Comparative example
    1.1 Configuration of laser device
    1.2 Operation of laser device
    1.3 Problem
2. Optical pulse stretcher using cylindrical mirror concentrating light in Z direction
    2.1 Schematic configuration
    2.2 Configuration of first optical pulse stretcher
    2.3 Operation of first optical pulse stretcher
    2.4 Effect of first optical pulse stretcher
    2.5 Configuration of second optical pulse stretcher
    2.6 Operation of second optical pulse stretcher
    2.7 Effect of second optical pulse stretcher
3. Optical pulse stretcher using cylindrical mirror concentrating light in short-length direction of beam cross section
    3.1 Configuration and operation of first optical pulse stretcher
    3.2 Effect of first optical pulse stretcher
    3.3 Configuration and operation of second optical pulse stretcher
    3.4 Effect of second optical pulse stretcher
4. Optical pulse stretcher using toroidal mirror concentrating light in two directions
    4.1 Configuration and operation of first optical pulse stretcher
    4.2 Effect of first optical pulse stretcher
    4.3 Configuration and operation of second optical pulse stretcher
    4.4 Effect of second optical pulse stretcher
5. Optical pulse stretcher capable of changing output beam position
    5.1 Schematic configuration
    5.2 Configuration of first optical pulse stretcher
    5.3 Operation
    5.4 Effect
6. Others Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numerals, and duplicate description thereof is omitted.

1. Comparative Example

1.1 Configuration of Laser Device

FIG. 1 schematically shows the configuration of a laser device according to a comparative example. The laser device according to the comparative example includes a master oscillator MO, a first beam steering unit 16, an amplifier PO, a second beam steering unit 26, and an optical pulse stretcher 29. The travel direction of pulse laser light B99 and B100 output from the optical pulse stretcher 29 is represented by the +Z direction. The discharge direction between discharge electrodes 11a, 11b of the master oscillator MO and between discharge electrodes 21a, 21b of the amplifier PO is represented by the +V direction or the −V direction. A direction perpendicular to the both is represented by the +H direction or the −H direction.

The master oscillator MO includes a laser chamber 10, a line narrowing module 14, and an output coupling mirror 15.

The laser chamber 10 is arranged on an optical path of a laser resonator configured by the line narrowing module 14 and the output coupling mirror 15. The laser chamber 10 is provided with two windows 10a, 10b. The laser chamber 10 accommodates the discharge electrodes 11a, 11b. The discharge electrodes 11a, 11b are connected to a pulse power source (not shown). The laser chamber 10 contains laser gas as a laser medium. The laser gas includes, for example, argon gas, fluorine gas, and neon gas. Alternatively, the laser gas includes, for example, krypton gas, fluorine gas, and neon gas.

The line narrowing module 14 includes wavelength selection elements such as a prism 14a and a grating 14b. The output coupling mirror 15 is configured by a partial reflection mirror.

The first beam steering unit 16 includes high reflection mirrors 16a, 16b.

The amplifier PO includes a laser chamber 20, a rear mirror 24, and an output coupling mirror 25. The laser chamber 20, the output coupling mirror 25, and windows 20a, 20b and discharge electrodes 21a, 21b associated with the laser chamber 20 are similar to the corresponding components in the master oscillator MO.

The rear mirror 24 is arranged on an optical path of the pulse laser light that has passed through the first beam steering unit 16. The rear mirror 24 is configured by a partial reflection mirror. The rear mirror 24 and the output coupling mirror 25 configure an optical resonator.

The second beam steering unit 26 includes high reflection mirrors 26a, 26b.

The optical pulse stretcher 29 is arranged on an optical path of the pulse laser light which has passed through the second beam steering unit 26. The optical pulse stretcher 29 includes a beam splitter 295 and first to fourth concave mirrors 291 to 294. Each of the first to fourth concave mirrors 291 to 294 is a spherical mirror. The optical path length of a delay optical path configured by the first to fourth concave mirrors 291 to 294 is, for example, 7 m.

1.2 Operation of Laser Device

In the master oscillator MO, the pulse power source (not shown) generates a pulse high voltage and applies the high voltage between the discharge electrode 11a, 11b.

When the high voltage is applied between the discharge electrodes 11a, 11b, discharge occurs between the discharge electrodes 11a, 11b. The laser gas in the laser chamber 10 is excited by the energy of the discharge and shifts to a high energy level. When the excited laser gas then shifts to a low energy level, light having a wavelength corresponding to the difference between the energy levels is emitted.

The light generated in the laser chamber 10 is output to the outside of the laser chamber 10 through the windows 10a, 10b. The beam width of the light output through the window 10a is expanded by the prism 14a, and then the light is incident on the grating 14b. The light incident on the grating 14b from the prism 14a is reflected by a plurality of grooves of the grating 14b and is diffracted in a direction corresponding to the wavelength of the light. The grating 14b is arranged in the Littrow arrangement, which causes the incident angle of the light incident on the grating 14b from the prism 14a to coincide with the diffraction angle of the diffracted light having a desired wavelength. Thus, light having a wavelength close to the desired wavelength returns into the laser chamber 10 via the prism 14a.

The output coupling mirror 15 transmits and outputs a part of the light output from the window 10b, and reflects the other parts back into the laser chamber 10.

In this way, the light output from the laser chamber 10 reciprocates between the line narrowing module 14 and the output coupling mirror 15. This light is amplified every time when passing through a discharge space between the discharge electrodes 11a, 11b. Further, this light is line narrowed each time being turned back in the line narrowing module 14. Thus, the light having undergone laser oscillation and line narrowing is output as pulse laser light from the output coupling mirror 15.

The pulse laser light output from the output coupling mirror 15 enters the laser chamber 20 through the first beam steering unit 16 and the rear mirror 24.

In the amplifier PO, in synchronization with the entrance of the pulse laser light into the laser chamber 20, a pulse power source (not shown) generates a pulse high voltage and applies the high voltage between the discharge electrodes 21a, 21b.

When the high voltage is applied between the discharge electrodes 21a, 21b, discharge occurs between the discharge electrodes 21a, 21b. The pulse laser light having entered the laser chamber 20 is amplified by the energy of the discharge.

The light amplified in the laser chamber 20 reciprocates between the rear mirror 24 and the output coupling mirror 25. This light is amplified every time when passing through a discharge space between the discharge electrodes 21a, 21b. The light thus amplified is output from the output coupling mirror 25 as the pulse laser light.

The pulse laser light output from the output coupling mirror 25 is incident on the beam splitter 295 of the optical pulse stretcher 29 in the +Z direction through the second beam steering unit 26. The beam splitter 295 transmits, in the +Z direction, a part of the pulse laser light incident in the +Z direction and outputs it as the pulse laser light B99, and reflects another part thereof in the −V direction. The light reflected in the −V direction is sequentially reflected by the first to fourth concave mirrors 291 to 294 and is incident in the −V direction on the beam splitter 295.

The beam cross section of the pulse laser light incident from the second beam steering unit 26 on the beam splitter 295 is imaged on the beam splitter 295 with a size of 1:1 owing to the first to fourth concave mirrors 291 to 294. The beam splitter 295 reflects, in the +Z direction, a part of the pulse laser light incident in the −V direction from the fourth concave mirror 294 and outputs it as the pulse laser light B100. The pulse laser light B99 and the pulse laser light B100 are substantially coaxial.

There is a time difference between the pulse laser light B99 and the pulse laser light B100 according to the optical path length of the delay optical path configured by the first to fourth concave mirrors 291 to 294. By spatially overlapping the pulse laser light B99 and the pulse laser light B100, it is possible to output the pulse laser light having an extended pulse width.

By extending the pulse width of the pulse laser light, occurrence of speckle on the surface of a workpiece is suppressed Speckle is the light and dark spots caused by interference when pulse laser light is scattered to homogenize the optical intensity distribution of the pulse laser light. An image obtained by photographing the light and dark spots is referred to as a speckle image. As a speckle evaluation index, the following speckle contrast SC is generally used.

$$SC = \sigma(I)/\mathrm{Avg}(I)$$

Here, $\sigma(I)$ is a standard deviation of intensity I in a speckle image and $\mathrm{Avg}(I)$ is an average value of the intensity I.

1.3 Problem

In the comparative example, the speckle contrast is reduced by extending the pulse width by the optical pulse stretcher 29. The speckle contrast can be further reduced by additionally arranging another optical pulse stretcher in which the optical path length of the delay optical path is different from that of the optical pulse stretcher 29 and further extending the pulse width.

However, when another optical pulse stretcher having a different optical path length of the delay optical path is added in addition to the optical pulse stretcher 29 having an optical path length of the delay optical path of, for example, 7 m, a delay optical path of 14 m, 35 m, or an even longer length may be required, which may cause inconvenience in transportation and maintenance.

On the other hand, adding an optical pulse stretcher having a short delay optical path provides a small effect in extending the pulse width. Further, when configuring a short delay optical path with the first to fourth concave mirrors, it is necessary to increase the incident angle of the pulse laser light on the first to fourth concave mirrors to increase the numerical aperture (NA) of the first to fourth concave mirrors. Therefore, astigmatism may occur. When astigmatism occurs, beam divergence and beam pointing may be adversely affected.

In some embodiments described below, a toroidal mirror is used instead of a spherical mirror or a planar mirror in an optical pulse stretcher having a short delay optical path, thereby suppressing the occurrence of astigmatism.

2. Optical Pulse Stretcher Using Cylindrical Mirror Concentrating Light in Z Direction

2.1 Schematic Configuration

Figure 2:
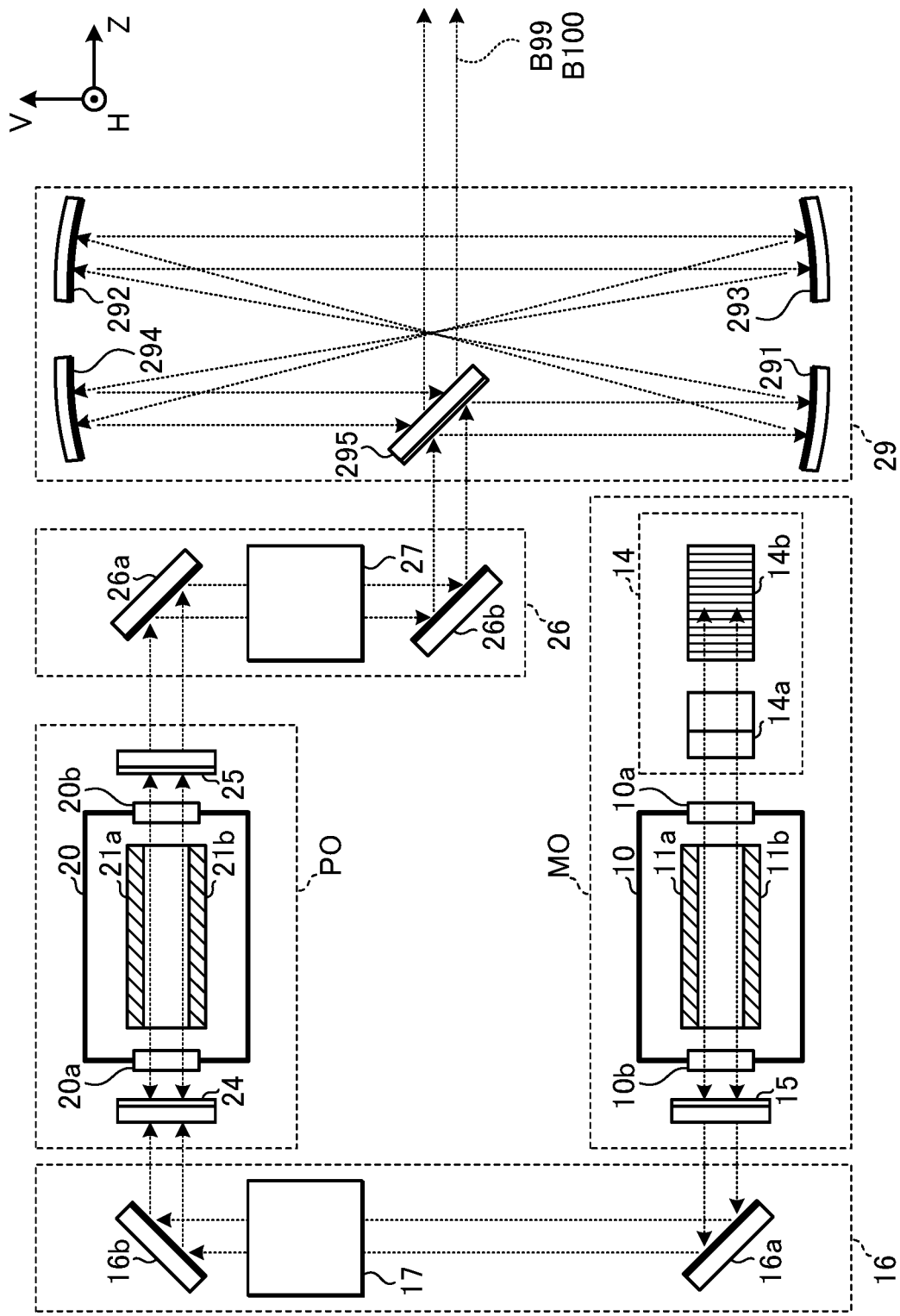
FIG. 2 schematically shows the configuration of the laser device of a first embodiment of the present disclosure.

FIG. 2 schematically shows the configuration of the laser device of a first embodiment of the present disclosure. In the first embodiment, a first optical pulse stretcher 17 using a first delay optical system including a plurality of concave toroidal mirrors is arranged between the high reflection mirrors 16a, 16b. That is, the first optical pulse stretcher 17 is arranged between the master oscillator MO and the amplifier PO.

In the first embodiment, further, a second optical pulse stretcher 27 using a plurality of concave toroidal mirrors is arranged between the high reflection mirror 26a, 26b.

In other respects, the configuration of the first embodiment is similar to that of the comparative example.

2.2 Configuration of First Optical Pulse Stretcher

Figure 3A:
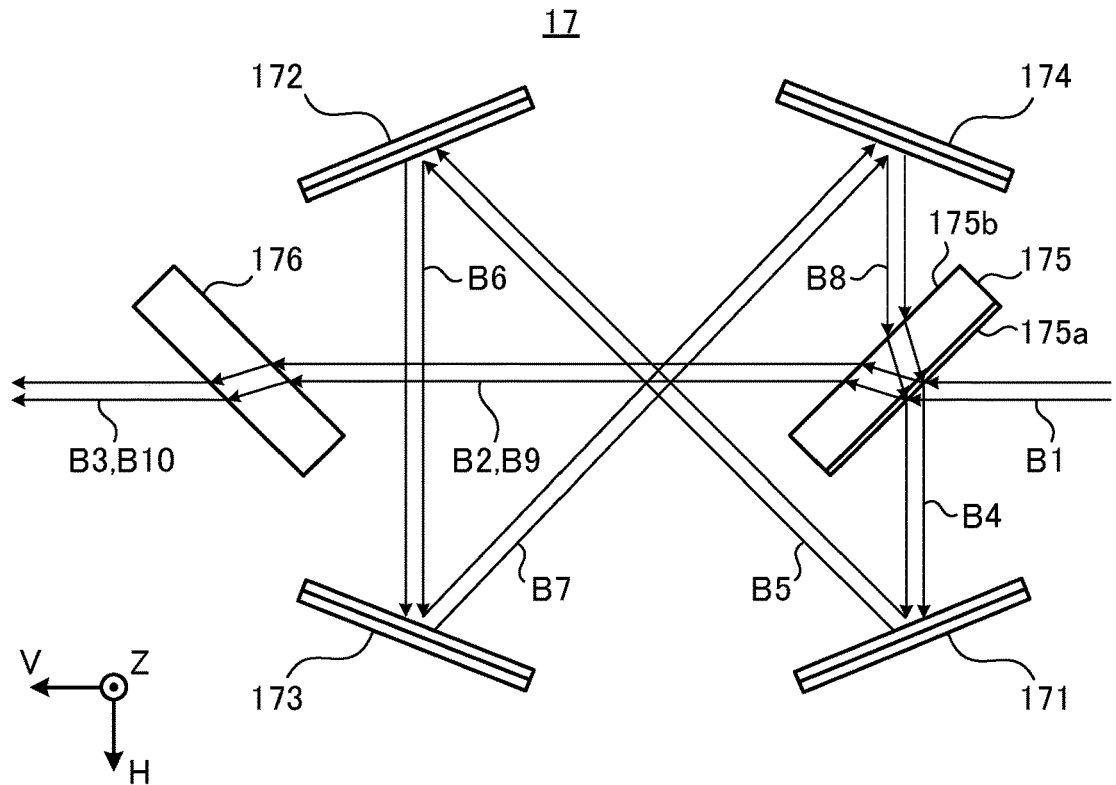
FIG. 3A is a view of a first optical pulse stretcher of the first embodiment viewed in the −Z direction.
Figure 3B:
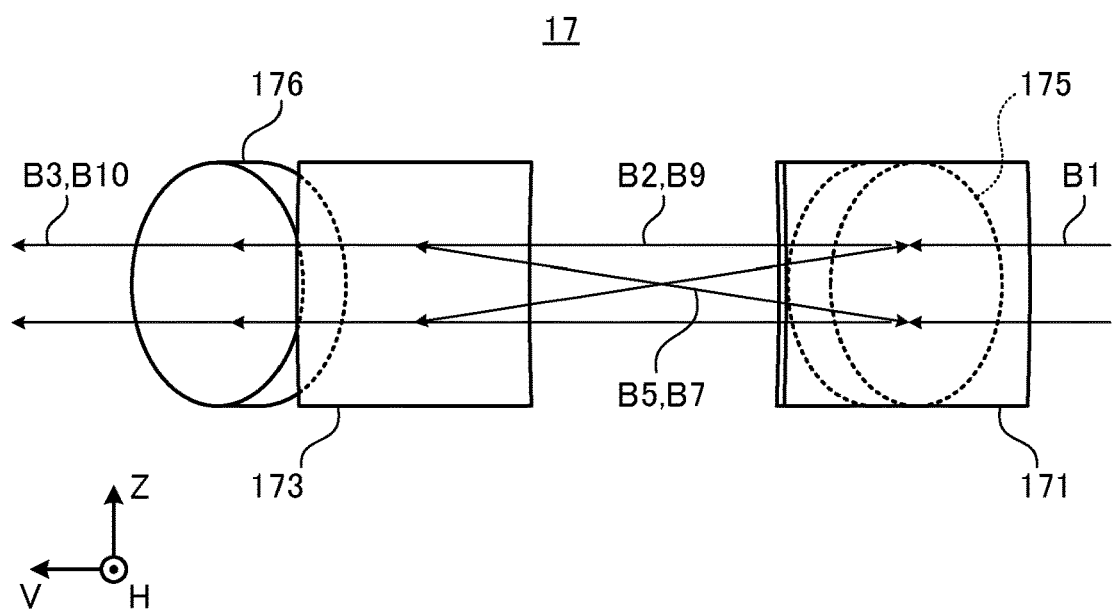
FIG. 3B is a view of the first optical pulse stretcher of the first embodiment viewed in the −H direction.
Figure 3C:
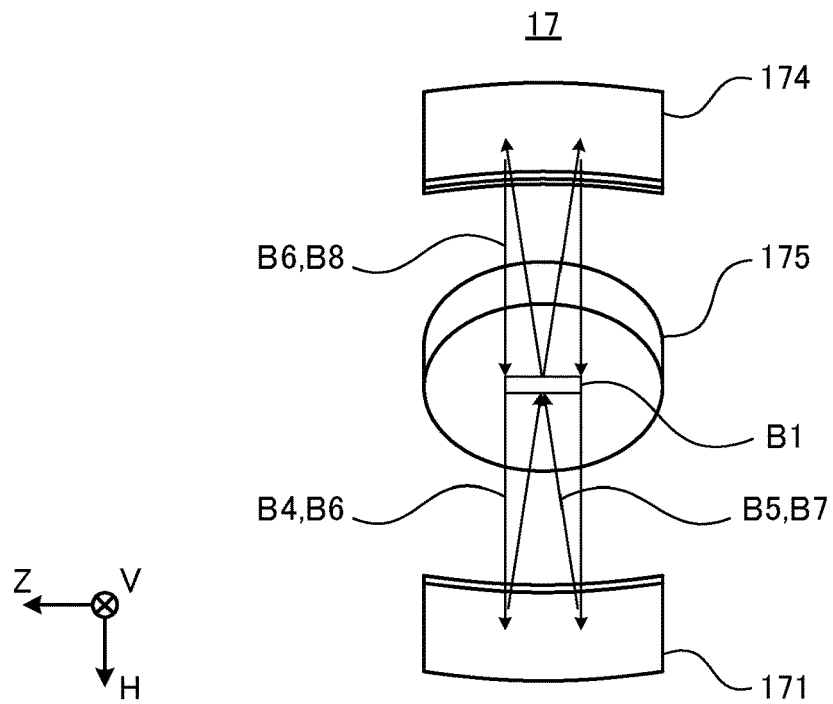
FIG. 3C is a view of the first optical pulse stretcher of the first embodiment viewed in the +V direction.
Figure 3D:
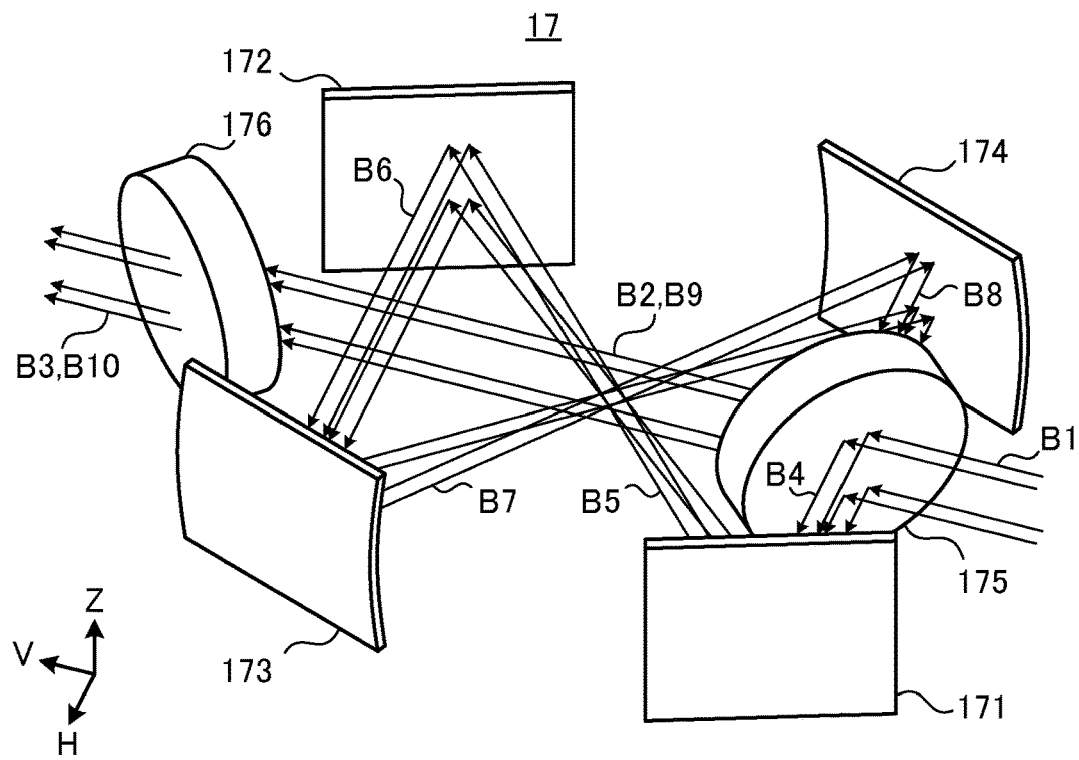
FIG. 3D is a perspective view of the first optical pulse stretcher of the first embodiment.

FIG. 3A is a view of the first optical pulse stretcher 17 of the first embodiment viewed in the −Z direction. FIG. 3B is a view of the first optical pulse stretcher 17 viewed in the −H direction. FIG. 3C is a view of the first optical pulse stretcher 17 viewed in the +V direction. FIG. 3D is a perspective view of the first optical pulse stretcher 17. The travel direction of the pulse laser light between the high reflection mirrors 16a, 16b is approximately the +V direction.

The first optical pulse stretcher 17 includes the first delay optical system including four concave cylindrical mirrors 171 to 174 as the plurality of concave toroidal mirrors, a beam splitter 175 including a first surface 175a and a second surface 175b, and a plane-parallel plate 176.

The beam splitter 175 is arranged on the optical path of pulse laser light B1 output from the master oscillator MO and reflected by the high reflection mirror 16a. As the beam splitter 175, for example, an element having a thickness of 7 mm and reflectance of 64% for P-polarized light is used.

The toroidal mirror is a mirror having a toroidal surface. The toroidal surface is a surface having first and second radii of curvature R1, R2 different in two perpendicular directions, and corresponds to a locus obtained by rotating a circle having the radius R1 about an axis being a straight line having a distance R3 from the center of the circle in the same plane as the circle. Here, the first radius of curvature R1 of the toroidal surface corresponds to the radius R1 of the circle, and the second radius of curvature R2 corresponds to the sum of the radius R1 of the circle and the distance R3 from the center of the circle to the rotation axis.

The cylindrical mirror is a mirror having a cylindrical surface. The cylindrical mirror is a kind of a toroidal mirror, and can be referred to as a toroidal mirror in which the second radius of curvature R2 is infinite.

The first optical pulse stretcher 17 configures a first optical path and a second optical path. The first optical path is an optical path through which a part of the pulse laser light B1 is transmitted and output as pulse laser light B2, B3. The second optical path is an optical path in which another part of the pulse laser light B1 is reflected as pulse laser light B4, B5, . . . , B9, and output as pulse laser light B10. Among the second optical path, the optical paths of the pulse laser light B4 to B8 are referred to as a delay optical path.

The optical path length of the delay optical path is in the range of 0.25 m or more and 1.5 m or less and is, for example, 0.3 m. When the optical path length of the delay optical path is 0.3 m, the radius of curvature R1 of each of the concave cylindrical mirrors 171 to 174 is, for example, 81.6 mm. The reason why the optical path length of the delay optical path is 0.25 m or more is as follows. Assuming that the center wavelength $\lambda_0$ of the pulse laser light is 193 nm and the spectral width $\Delta\lambda$ is 0.15 μm, the temporal coherence length L of the pulse laser light is about 0.25 m as follows.

$$L=\lambda_0^2/\Delta\lambda \approx 0.25$$

If the optical path length of the delay optical path is shorter than the temporal coherence length L, interference may occur when split light is overlapped after time difference is given thereto by the delay optical path. Therefore, it is desirable that the optical path length of the delay optical path is equal to or more than the temporal coherence length L, that is, 0.25 m or more.

As the spectral width $\Delta\lambda$ described above, for example, an index called E95 is used.

Figure 4:
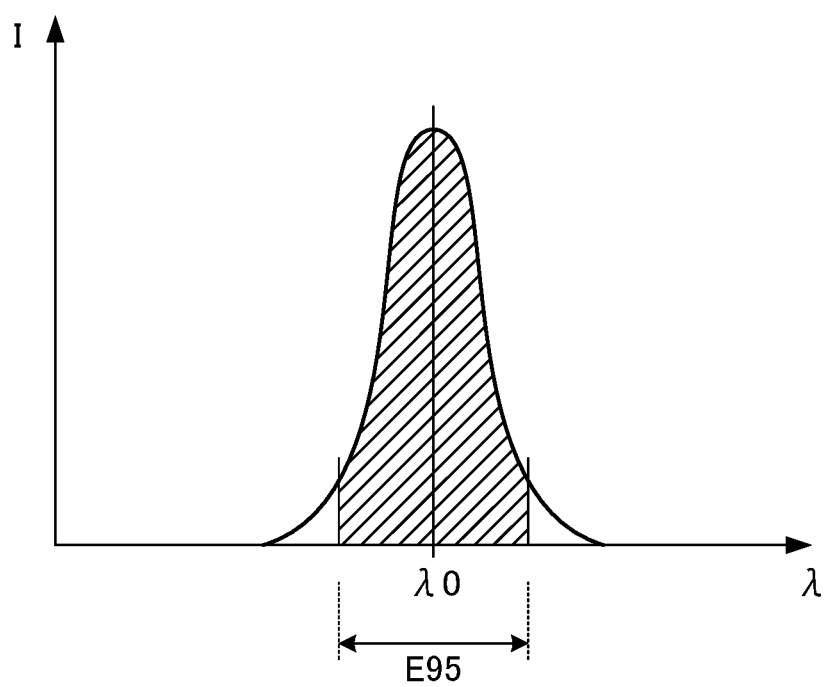
FIG. 4 shows an example of a spectral waveform for explaining E95.

FIG. 4 shows an example of a spectral waveform for explaining E95. The horizontal axis of FIG. 4 represents a wavelength $\lambda$ and the vertical axis represents light intensity I. The total width of a portion occupying 95% of the total energy of the spectrum with the center wavelength $\lambda_0$ as the center is denoted by E95.

Figure 3E:
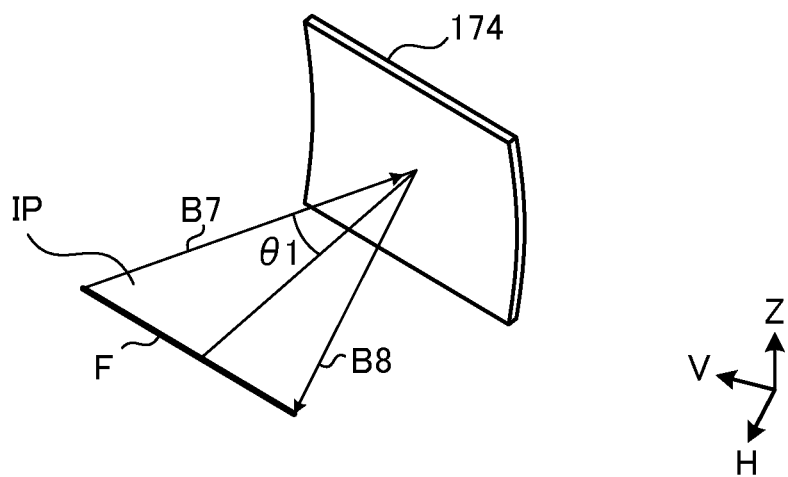
FIG. 3E shows an optical axis of pulse laser light incident on a concave cylindrical mirror of the first embodiment and an optical axis of the pulse laser light reflected by the concave cylindrical mirror.

FIG. 3E shows an optical axis of the pulse laser light B7 incident on the concave cylindrical mirror 174 and an optical axis of the pulse laser light B8 reflected by the concave cylindrical mirror 174. The optical axis means the center axis of the optical path.

As shown in FIG. 3E, a focal axis F is located at a predetermined distance from the concave cylindrical mirror 174. The focal axis F is located in the same plane as an incident plane IP of the pulse laser light B7. In the other concave cylindrical mirrors 171 to 173 as well, each focal axis F is located in the same plane as the corresponding incident plane IP of the pulse laser light.

As shown in FIG. 3C, the pulse laser light B1 has a substantially rectangular beam cross section. The longitudinal direction of the beam cross section substantially coincides with the Z direction. In each of the pulse laser light B2 to B10, the longitudinal direction of the beam cross section substantially coincides with the Z direction.

Here, the pulse laser light B5 reflected by the concave cylindrical mirror 171 is concentrated in the Z direction, and then is incident on the concave cylindrical mirror 172 while spreading in the Z direction. The pulse laser light B7 reflected by the concave cylindrical mirror 173 is also concentrated in the Z direction, and then is incident on the concave cylindrical mirror 174 while spreading in the Z direction. Therefore, the longitudinal direction of the beam cross section of each of the pulse laser light B5, B7 approximately coincides with the Z direction except in the vicinity of their light concentration position.

The concave cylindrical mirror 172 and the concave cylindrical mirror 174 collimate each of the pulse laser light B5, B7 having passed through the concentration position and incident thereon while spreading in the Z direction by reflecting them as the pulse laser light B6, B8, respectively.

The concave cylindrical mirror 171 or 173 corresponds to the first concave cylindrical mirror in the present disclosure, and the concave cylindrical mirror 172 or 174 corresponds to the second concave cylindrical mirror in the present disclosure.

The pulse laser light B4 is incident on the concave cylindrical mirror 171 while being inclined with respect to the Z-axis. Similarly, each of the pulse laser light B5, B6, B7 is incident on the concave cylindrical mirrors 172, 173, 174, respectively, while being inclined with respect to the Z-axis. An incident angle θ1 of each of the pulse laser light B4 to B7 on the concave cylindrical mirrors 171 to 174 is within the range of 8° or more and 25° or less. For example, the incident angle θ1 is 23°. Even when the incident angle θ1 is large as described above, since the first delay optical system is configured by the concave cylindrical mirrors 171 to 174, the occurrence of astigmatism is suppressed.

2.3 Operation of First Optical Pulse Stretcher

The pulse laser light B1 is incident on the first surface 175a of the beam splitter 175 in the +V direction. The beam splitter 175 transmits, in the +V direction, a part of the pulse laser light B1 incident in the +V direction as the pulse laser light B2, and reflects another part thereof in the +H direction as the pulse laser light B4. The pulse laser light B2 is incident on the plane-parallel plate 176. The plane-parallel plate 176 transmits and outputs the pulse laser light B2 in the +V direction as the pulse laser light B3. The +V direction corresponds to the first direction in the present disclosure. The +H direction corresponds to the second direction in the present disclosure.

The pulse laser light B4 is reflected sequentially by the concave cylindrical mirrors 171 to 174 as the pulse laser light B5 to B8. The pulse laser light B8 is incident on the second surface 175b of the beam splitter 175 in the +H direction. The concave cylindrical mirrors 171, 173 concentrate the pulse laser light B5, B7 at large NAs and the concave cylindrical mirrors 172, 174 collimate the pulse laser light B5, B7, respectively, thereby reducing spatial coherence. The beam cross section of the pulse laser light B1 at the first surface 175a is imaged with a size of 1:1 in the Z direction when the pulse laser light B8 reaches the first surface 175a. A part of the pulse laser light B8 is reflected at the first surface 175a, output as the pulse laser light B9 in the +V direction, and then output from the plane-parallel plate 176 as the pulse laser light B10. Each of the pulse laser light B9, B10 pass through an optical path that is substantially identical to the optical path of the pulse laser light B2, B3, respectively. The pulse laser light B3 corresponds to the first beam in the present disclosure, and the pulse laser light B10 corresponds to the second beam in the present disclosure.

The plane-parallel plate 176 compensates for deviation of the optical axis that occurs when a part of the pulse laser light B1 is transmitted through the beam splitter 175. Thus, the plane-parallel plate 176 can make the optical axis of the pulse laser light B3 substantially coaxial with the extension line of the optical axis of the pulse laser light B1. The plane-parallel plate 176 corresponds to the optical element that compensates for optical axis deviation in the present disclosure.

2.4 Effect of First Optical Pulse Stretcher

According to the first embodiment, the first optical pulse stretcher 17 outputs, in a spatially overlapped manner, the pulse laser light B3 transmitted through the beam splitter 175 and the pulse laser light B10 reflected by the beam splitter 175 and passing through the first delay optical system to have reduced spatial coherence. Thus, the speckle contrast can be reduced.

According to the first embodiment, since the optical path length of the delay optical path is short, the first optical pulse stretcher 17 can be made compact. Therefore, it is also possible to arrange the first optical pulse stretcher 17 inside the laser device. For example, the first optical pulse stretcher 17 may be arranged between the master oscillator MO and the amplifier PO. Further, transportation and maintenance of components can be easily carried out.

According to the first embodiment, since the concave cylindrical mirrors 171 to 174 are used, even when the optical path length of the delay optical path is short and the incident angle θ1 is large, the occurrence of astigmatism is suppressed. Therefore, adverse effects on beam divergence and beam pointing can be suppressed.

Further, since the delay optical path is configured by a transfer optical system and imaging is performed in the Z direction, the beam spread of the output pulse laser light B10 in the Z direction is reduced. Therefore, energy loss is reduced.

2.5 Configuration of Second Optical Pulse Stretcher

Figure 5A:
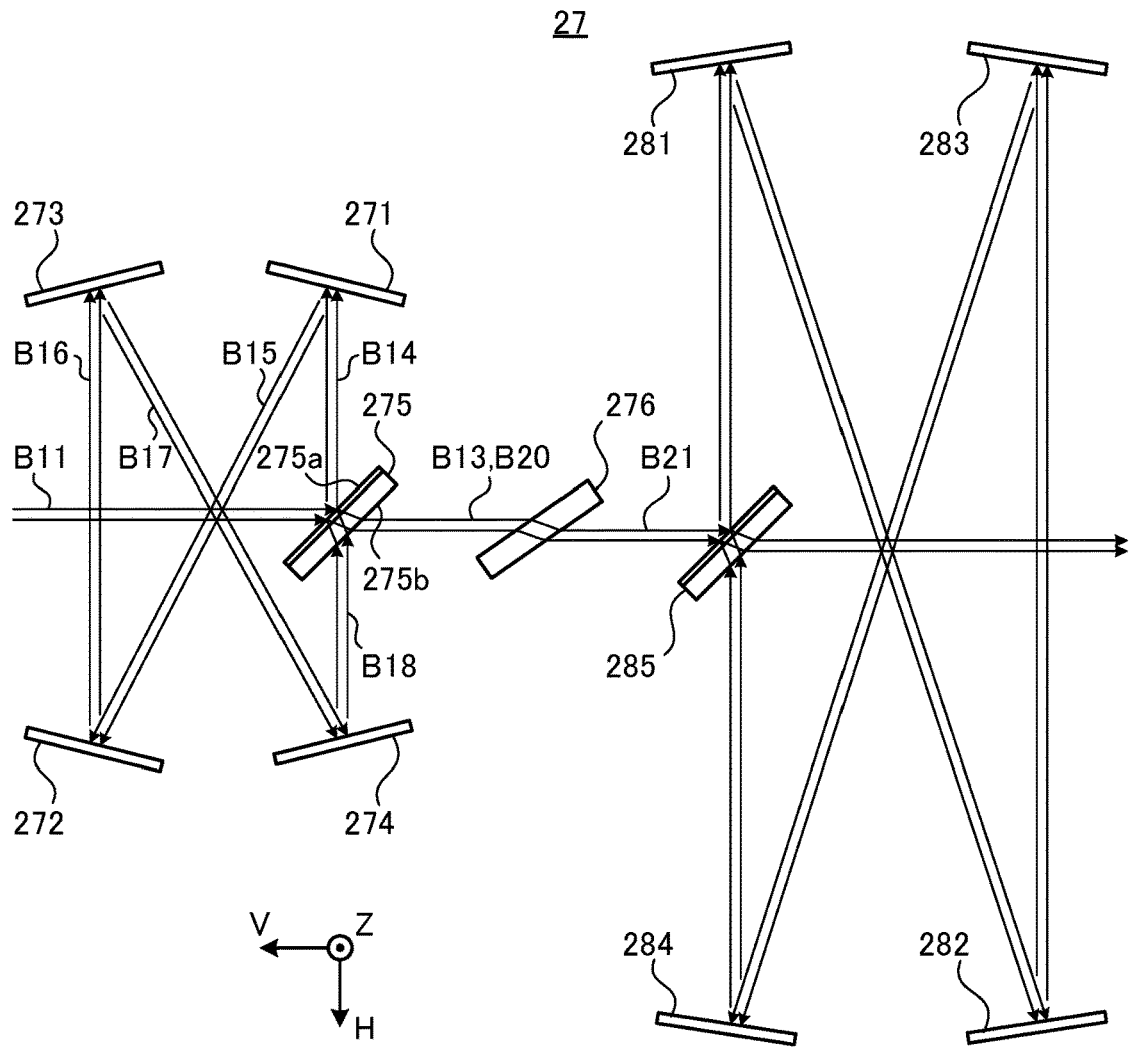
FIG. 5A is a view of a second optical pulse stretcher of the first embodiment viewed in the −Z direction.
Figure 5B:
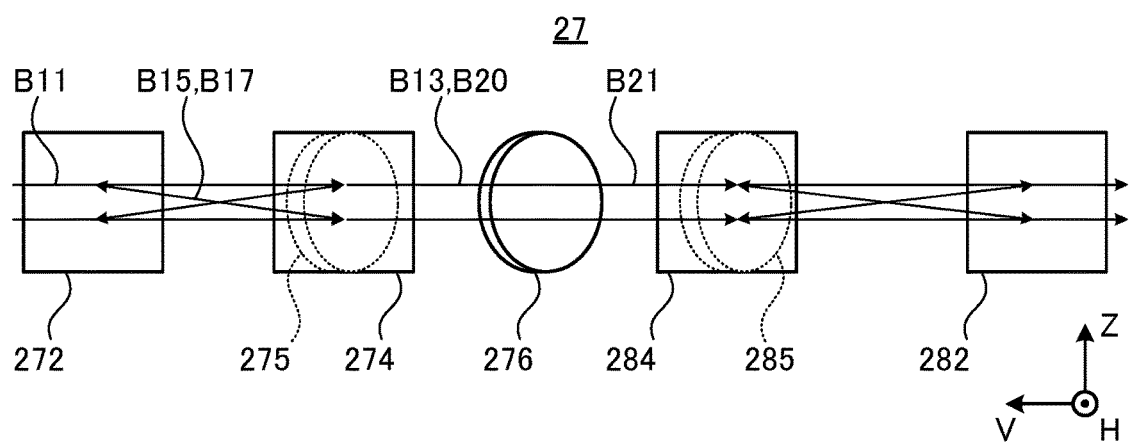
FIG. 5B is a view of the second optical pulse stretcher of the first embodiment viewed in the −H direction.

FIG. 5A is a view of a second optical pulse stretcher 27 of the first embodiment viewed in the −Z direction. FIG. 5B is a view of the second optical pulse stretcher 27 viewed in the −H direction. The travel direction of the pulse laser light between the high reflection mirrors 26a, 26b is approximately identical to the −V direction.

The second optical pulse stretcher 27 includes two delay optical paths having different optical path lengths. The second optical pulse stretcher 27 includes a second delay optical system including four concave cylindrical mirrors 271 to 274, a third delay optical system including another four concave cylindrical mirrors 281 to 284, beam splitters 275, 285, and a plane-parallel plate 276. It is desirable that the optical path lengths of the first, second, and third delay optical systems are different from each other. The optical path length of the first delay optical system may be shorter than the optical path length of the second delay optical system and the optical path length of the second delay optical system may be shorter than the optical path length of the third delay optical system. The optical path length of the delay optical path configured by the second delay optical system is, for example, 0.6 m, and the optical path length of the delay optical path configured by the third delay optical system is, for example, 1.2 m.

The first radius of curvature R1 of each of the concave cylindrical mirrors 271 to 274 is, for example, 153.7 mm.

The first radius of curvature R1 of each of the concave cylindrical mirrors 281 to 284 is, for example, 303.4 mm.

As each of the beam splitters 275, 285, for example, an element having a thickness of 7 mm and reflectance of 64% for P-polarized light is used.

An incident angle $\theta 2$ of each of the pulse laser light on the concave cylindrical mirrors 271 to 274 is within the range of 8° or more and 25° or less. For example, the incident angle $\theta 2$ is 14°.

An incident angle $\theta 3$ of each of the pulse laser light on the concave cylindrical mirrors 281 to 284 is within the range of 8° or more and 25° or less. For example, the incident angle $\theta 3$ is 9°.

In other respects, the configuration of the second optical pulse stretcher 27 is similar to that of the first optical pulse stretcher 17.

2.6 Operation of Second Optical Pulse Stretcher

Pulse laser light B11 output from the amplifier PO is incident on a third surface 275a of the beam splitter 275 in the −V direction. The beam splitter 275 transmits, in the −V direction as pulse laser light B13, a part of the pulse laser light B11 incident in the −V direction, and reflects another part thereof in the −H direction as pulse laser light B14. The pulse laser light B13 is incident on the plane-parallel plate 276. The plane-parallel plate 276 transmits and outputs the pulse laser light B13 in the −V direction as pulse laser light B21. The −V direction corresponds to the third direction in the present disclosure. The −H direction corresponds to the fourth direction in the present disclosure.

The pulse laser light B14 is sequentially reflected by the concave cylindrical mirrors 271 to 274 as the pulse laser light B15 to B18. The pulse laser light B18 is incident on a fourth surface 275b of the beam splitter 275 in the −H direction. The concave cylindrical mirrors 271, 273 concentrate the pulse laser light B15, B17 at large NAs in the Z direction and the concave cylindrical mirrors 272, 274 collimate the pulse laser light B15, B17, respectively, thereby reducing spatial coherence. The beam cross section of the pulse laser light B11 at the third surface 275a is imaged with a size of 1:1 in the Z direction when the pulse laser light B18 reaches the third surface 275a. A part of the pulse laser light B18 is reflected at the third surface 275a, output as the pulse laser light B20 in the −V direction, and then output from the plane-parallel plate 276 as the pulse laser light B21. The pulse laser light B20 passes through an optical path that is substantially identical to the optical path of the pulse laser light B13. The pulse laser light B13 corresponds to the first beam in the present disclosure, and the pulse laser light B20 corresponds to the second beam in the present disclosure.

Here, the operation of the second delay optical system including the concave cylindrical mirrors 271 to 274 has been described, but the same applies to the operation of the third delay optical system including the concave cylindrical mirrors 281 to 284.

The plane-parallel plate 276 may compensate for deviation of the optical axis that occurs when the pulse laser light is transmitted through the beam splitters 275, 285 or may shift the optical axis to another desired position.

2.7 Effect of Second Optical Pulse Stretcher

According to the first embodiment, the second optical pulse stretcher 27 can reduce the speckle contrast by the same effect as the first optical pulse stretcher 17. Since the optical path lengths of the first, second, and third delay optical systems are different from each other, it is possible to prevent a part of light delayed by one delay optical system from returning to the original state by another delay optical system. Therefore, in addition to the effect of reducing the speckle contrast by the first optical pulse stretcher 17, the speckle contrast can be further reduced by the second optical pulse stretcher 27.

3. Optical Pulse Stretcher Using Cylindrical Mirror Concentrating Light in Short-length Direction of Beam Cross Section

3.1 Configuration and Operation of First Optical Pulse Stretcher

Figure 6A:
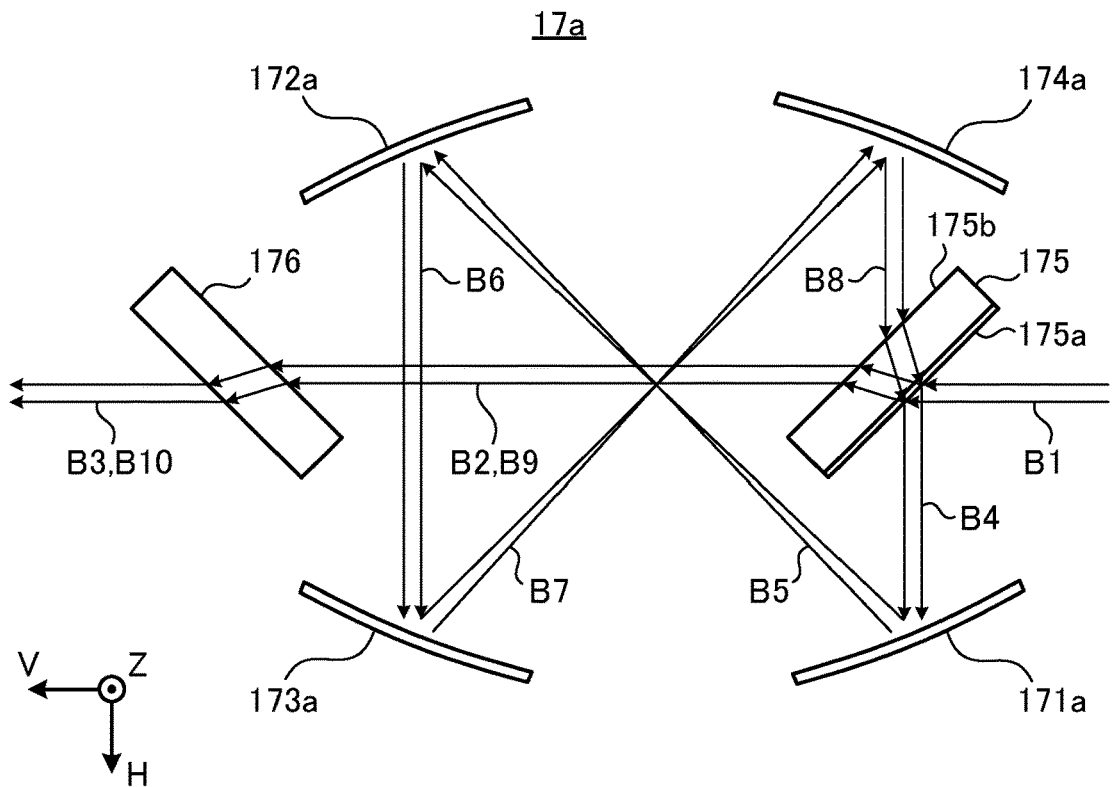
FIG. 6A is a view of the second optical pulse stretcher of a second embodiment of the present disclosure viewed in the −Z direction.
Figure 6B:
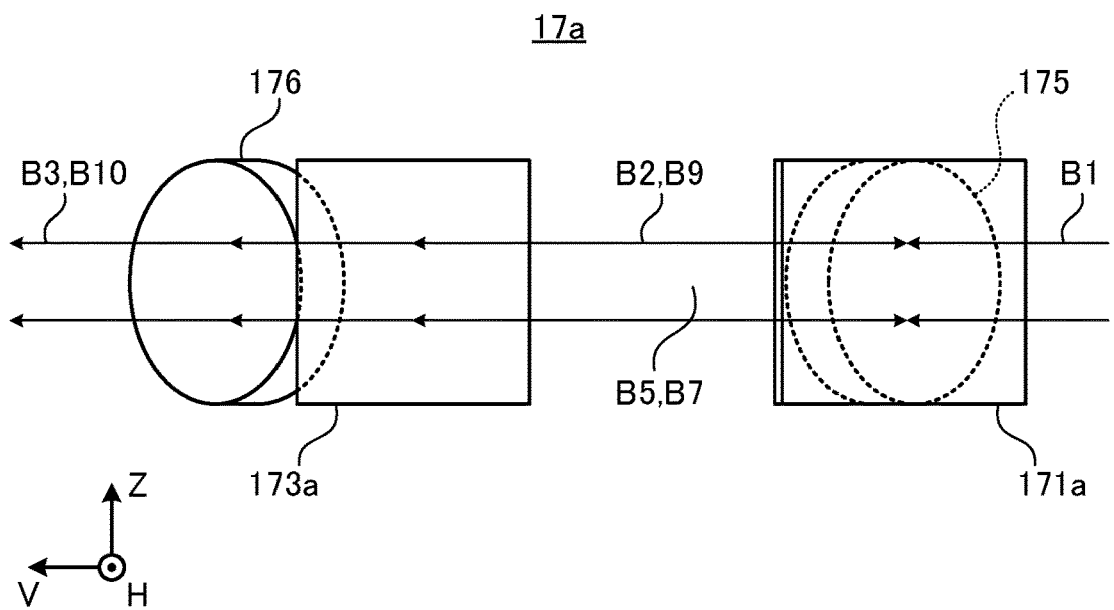
FIG. 6B is a view of the first optical pulse stretcher of the second embodiment viewed in the −H direction.
Figure 6C:
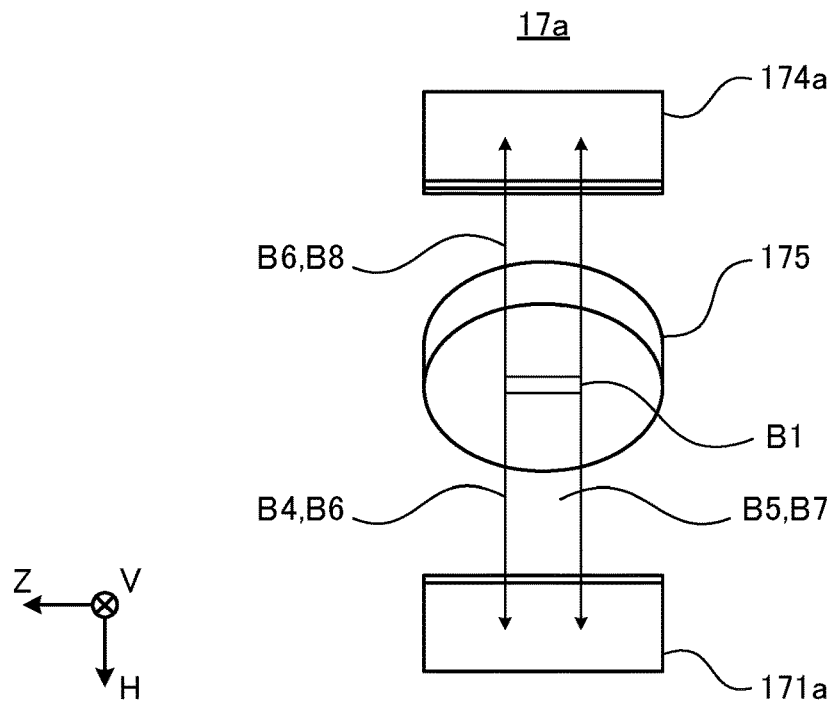
FIG. 6C is a view of the first optical pulse stretcher of the second embodiment viewed in the +V direction.
Figure 6D:
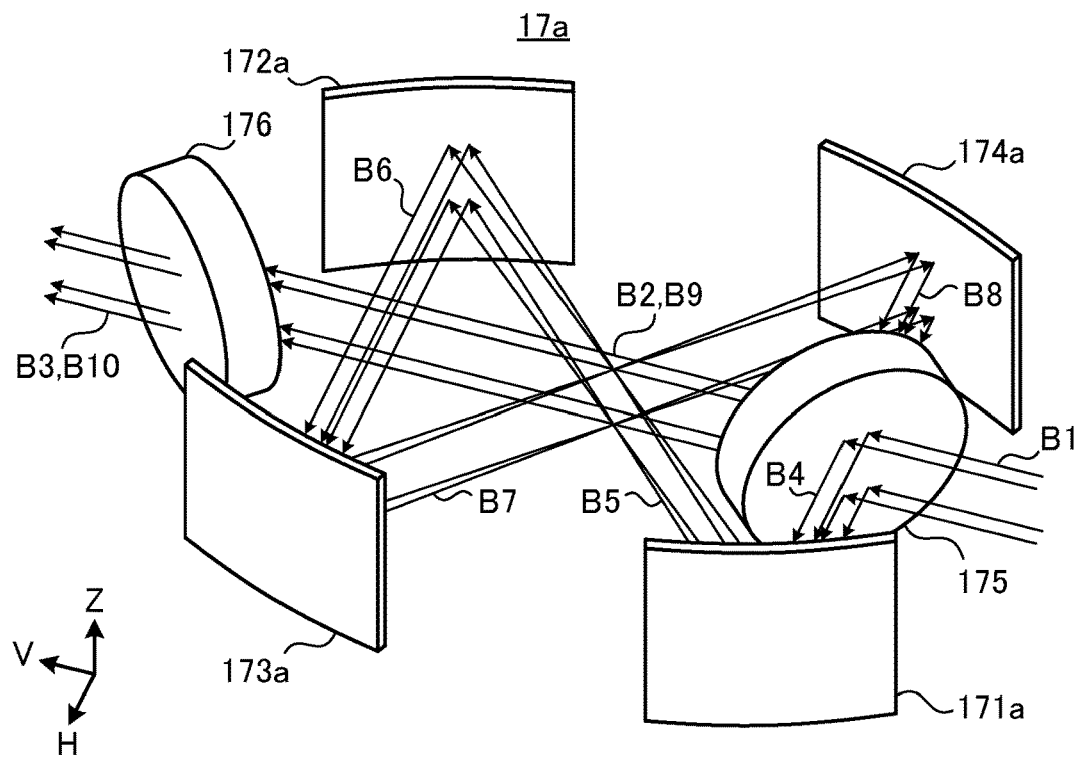
FIG. 6D is a perspective view of the first optical pulse stretcher of the second embodiment.

FIG. 6A is a view of a first optical pulse stretcher 17a of a second embodiment of the present disclosure viewed in the −Z direction. FIG. 6B is a view of the first optical pulse stretcher 17a viewed in the −H direction. FIG. 6C is a view of the first optical pulse stretcher 17a viewed in the +V direction. FIG. 6D is a perspective view of the first optical pulse stretcher 17a.

The first optical pulse stretcher 17a includes four concave cylindrical mirrors 171a to 174a.

Figure 6E:
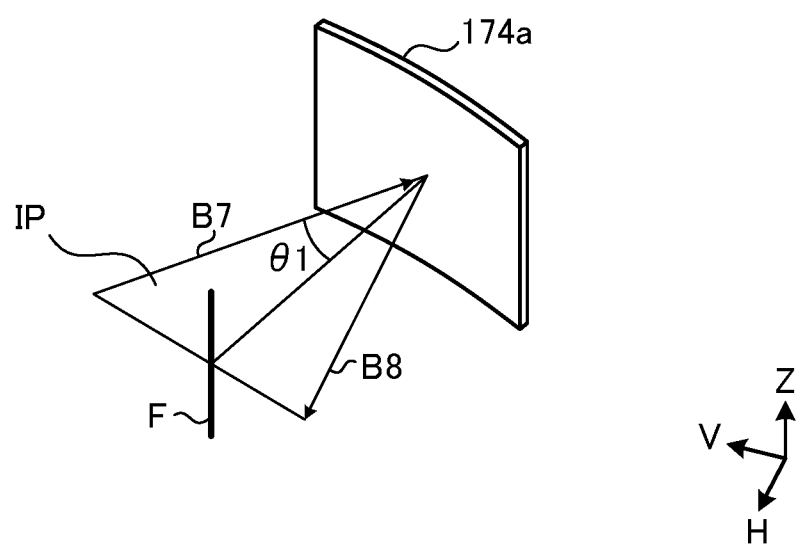
FIG. 6E shows an optical axis of the pulse laser light incident on the concave cylindrical mirror of the second embodiment and an optical axis of the pulse laser light reflected by the concave cylindrical mirror.

FIG. 6E shows an optical axis of the pulse laser light B7 incident on the concave cylindrical mirror 174a and an optical axis of the pulse laser light B8 reflected by the concave cylindrical mirror 174a.

As shown in FIG. 6E, the focal axis F of the concave cylindrical mirror 174a is perpendicular to the incident plane IP of the pulse laser light B7. In the other concave cylindrical mirrors 171a to 173a as well, each focal axis F is perpendicular to the corresponding incident plane IP of the pulse laser light.

Thus, the directions of the focal axes F of the concave cylindrical mirrors 171a to 174a of the second embodiment are different from those of the concave cylindrical mirrors 171 to 174 of the first embodiment.

As shown in FIG. 6C, the pulse laser light B1 has a substantially rectangular beam cross section. The longitudinal direction of the beam cross section substantially coincides with the Z direction. In each of the pulse laser light B2 to B10 as well, the longitudinal direction of the beam cross section substantially coincides with the Z direction. In each of the pulse laser light B1 to B10, the direction perpendicular to the longitudinal direction of the beam cross section is referred to as the short-length direction.

The pulse laser light B5 reflected by the concave cylindrical mirror 171a is concentrated in the short-length direction of the beam cross section, and then is incident on the concave cylindrical mirror 172a while spreading in the short-length direction of the beam cross section. The pulse laser light B7 reflected by the concave cylindrical mirror 173a is also concentrated in the short-length direction of the beam cross section, and then is incident on the concave cylindrical mirror 174a while spreading in the short-length direction of the beam cross section.

The concave cylindrical mirror 172a and the concave cylindrical mirror 174a collimate the pulse laser light B5, B7 having passed through the concentration position and incident thereon while spreading in the short-length direction of the beam cross section by reflecting them as the pulse laser light B6, B8, respectively.

The concave cylindrical mirror 171a or 173a corresponds to the first concave cylindrical mirror in the present disclosure, and the concave cylindrical mirror 172a or 174a corresponds to the second concave cylindrical mirror in the present disclosure.

In other respects, the configuration and operation of the first optical pulse stretcher 17a are similar to those of the first optical pulse stretcher 17 of the first embodiment.

3.2 Effect of First Optical Pulse Stretcher

In the second embodiment as well, since the pulse laser light passes through the first delay optical system to reduce the spatial coherence, the speckle contrast can be reduced.

Further, since the optical path length of the delay optical path is short, the first optical pulse stretcher 17a can be made compact.

According to the second embodiment, since the concave cylindrical mirrors 171a to 174a are used, even when the optical path length of the delay optical path is short and the incident angle θ1 is large, the occurrence of astigmatism is suppressed.

Further, since the delay optical path is configured by the transfer optical system and imaging is performed in the short-length direction of the beam cross section, the beam spread of the output pulse laser light B10 in the short-length direction of the beam cross section is reduced. Therefore, energy loss is reduced.

3.3 Configuration and Operation of Second Optical Pulse Stretcher

Figure 7A:
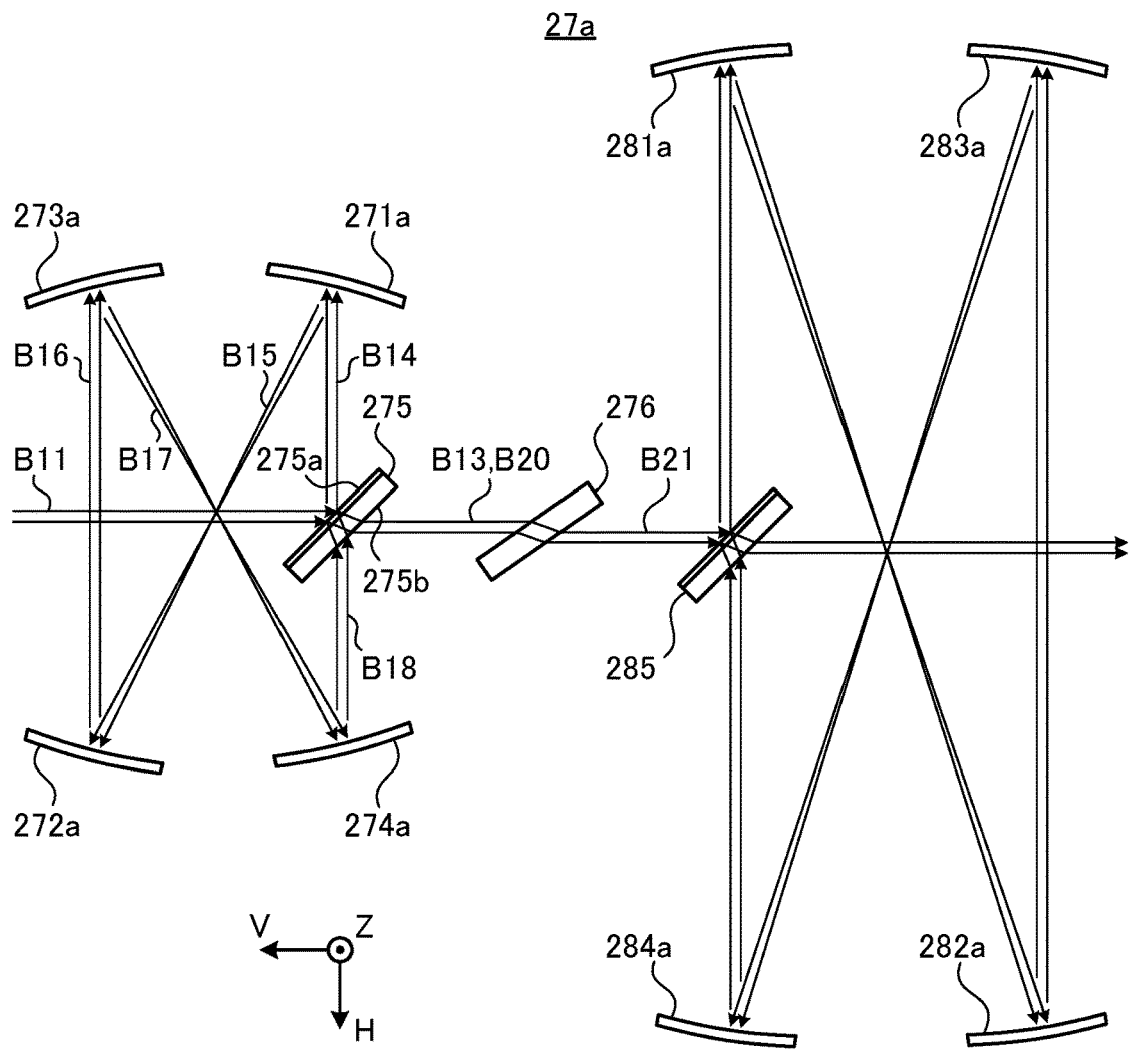
FIG. 7A is a view of the second optical pulse stretcher of the second embodiment viewed in the −Z direction.
Figure 7B:
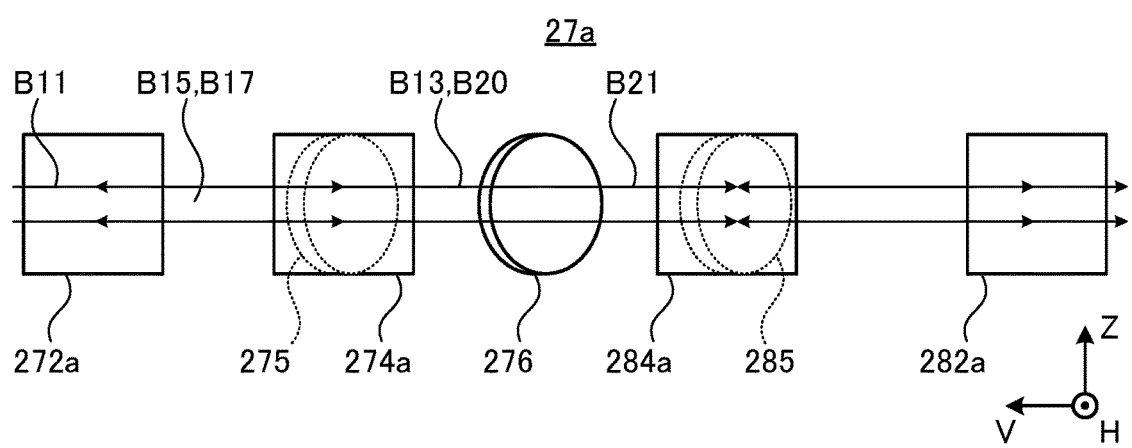
FIG. 7B is a view of the second optical pulse stretcher of the second embodiment viewed in the −H direction.

FIG. 7A is a view of a second optical pulse stretcher 27a of the second embodiment viewed in the −Z direction. FIG. 7B is a view of the second optical pulse stretcher 27a viewed in the −H direction.

The second optical pulse stretcher 27a includes a second delay optical system including four concave cylindrical mirrors 271a to 274a, and a third delay optical system including another four concave cylindrical mirrors 281a to 284a.

The focal axis F of each of the concave cylindrical mirrors 271a to 274a and 281a to 284a is perpendicular to the corresponding incident plane IP of the pulse laser light.

Therefore, the concave cylindrical mirrors 271a, 273a, 281a, 283a concentrate the pulse laser light in the short-length direction of the beam cross section and the concave cylindrical mirrors 272a, 274a, 282a, 284a collimate the pulse laser light, respectively, thereby reducing spatial coherence.

In other respects, the configuration and operation of the second optical pulse stretcher 27a are similar to those of the second optical pulse stretcher 27 of the first embodiment.

3.4 Effect of Second Optical Pulse Stretcher

According to the second embodiment as well, the second optical pulse stretcher 27a can reduce the speckle contrast by the same effect as the first optical pulse stretcher 17a. Since the optical path lengths of the first, second, and third delay optical systems are different from each other, it is possible to prevent a part of light delayed by one delay optical system from returning to the original state by another delay optical system. Therefore, in addition to the effect of reducing the speckle contrast by the first optical pulse stretcher 17a, the speckle contrast can be further reduced by the second optical pulse stretcher 27a.

4. Optical Pulse Stretcher Using Toroidal Mirror Concentrating Light in Two Directions

4.1 Configuration and Operation of First Optical Pulse Stretcher

Figure 8A:
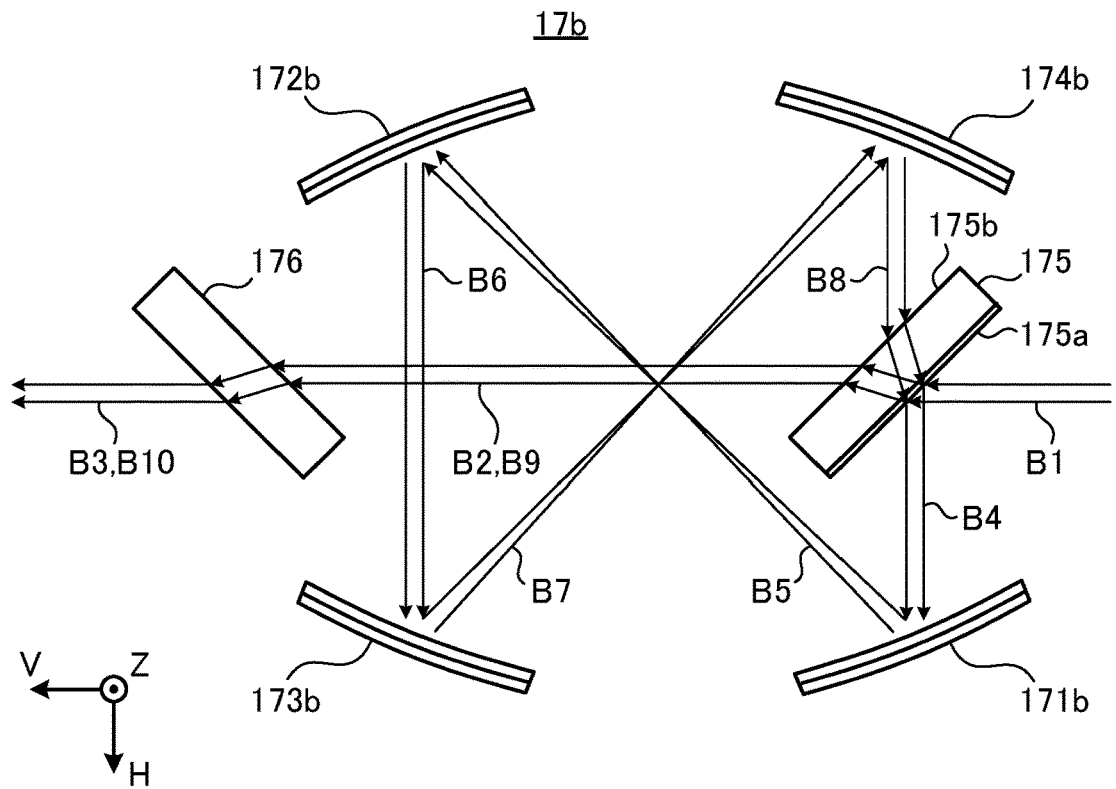
FIG. 8A is a view of the first optical pulse stretcher of a third embodiment of the present disclosure viewed in the −Z direction.
Figure 8B:
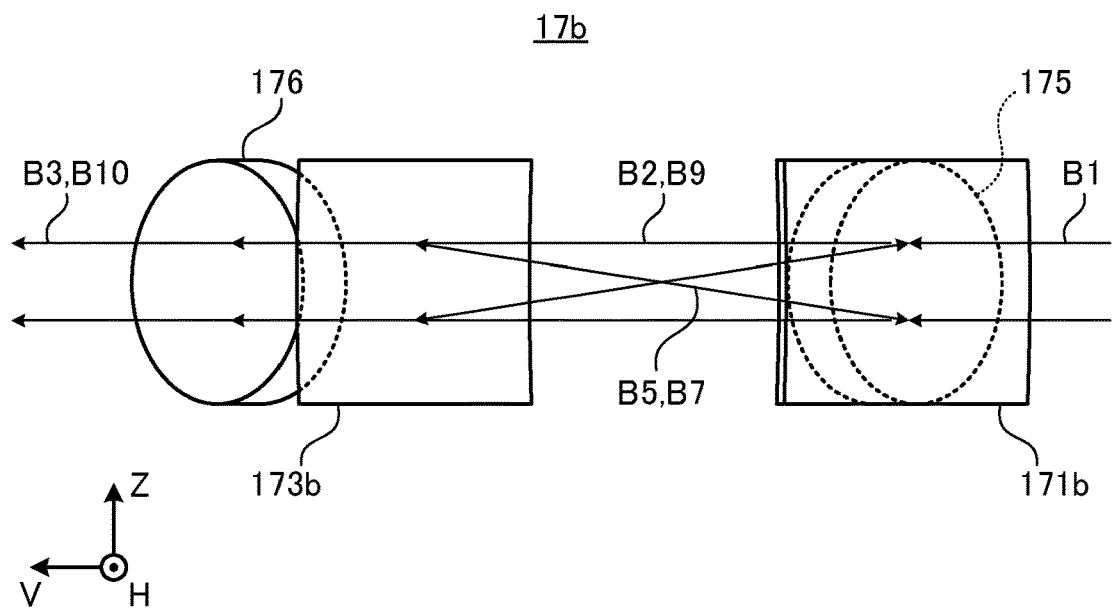
FIG. 8B is a view of the first optical pulse stretcher of the third embodiment viewed in the −H direction.
Figure 8C:
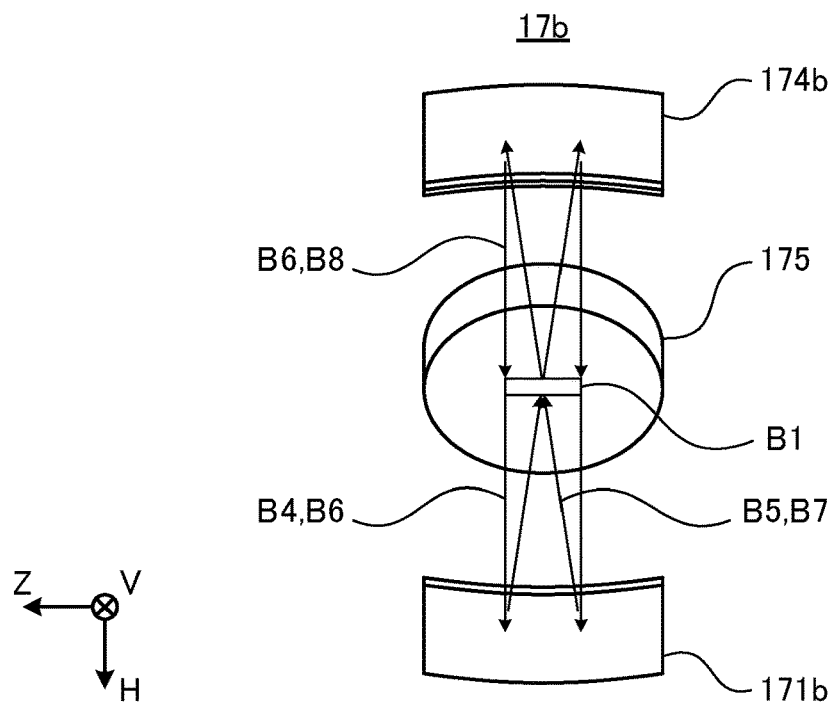
FIG. 8C is a view of the first optical pulse stretcher of the third embodiment viewed in the +V direction.
Figure 8D:
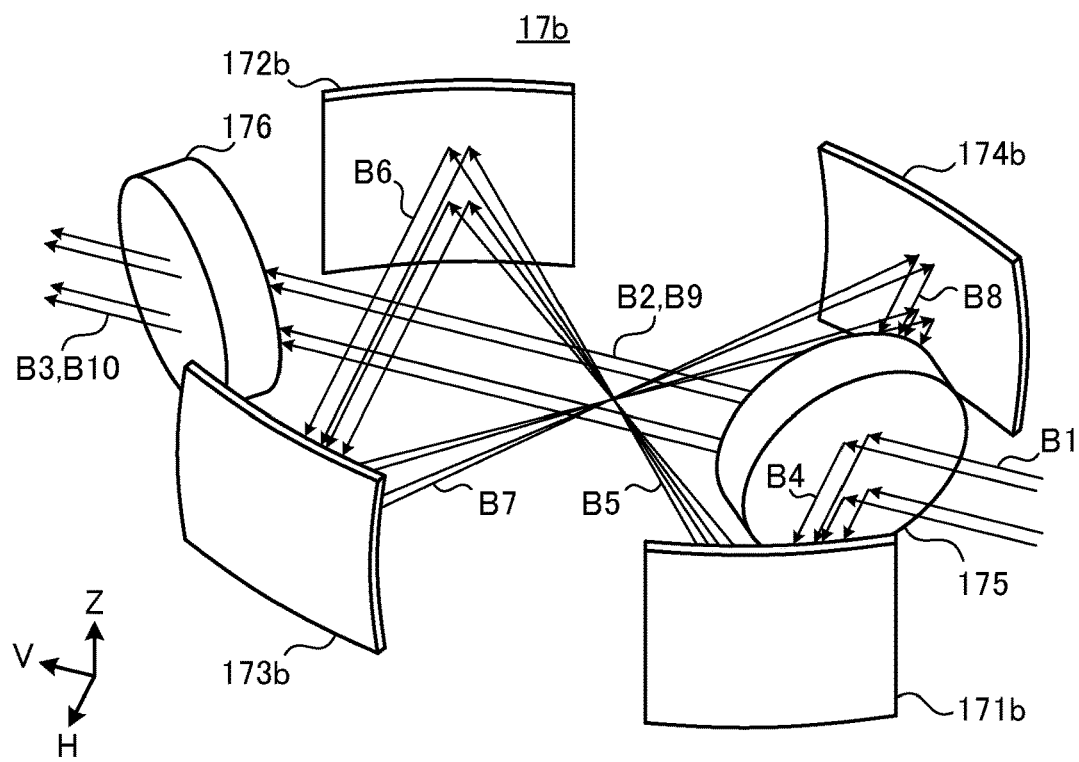
FIG. 8D is a perspective view of the first optical pulse stretcher of the third embodiment.

FIG. 8A is a view of a first optical pulse stretcher 17b of a third embodiment of the present disclosure viewed in the −Z direction. FIG. 8B is a view of the first optical pulse stretcher 17b viewed in the −H direction. FIG. 8C is a view of the first optical pulse stretcher 17b viewed in the +V direction. FIG. 8D is a perspective view of the first optical pulse stretcher 17b.

The first optical pulse stretcher 17b includes four concave toroidal mirrors 171b to 174b.

Figure 8E:
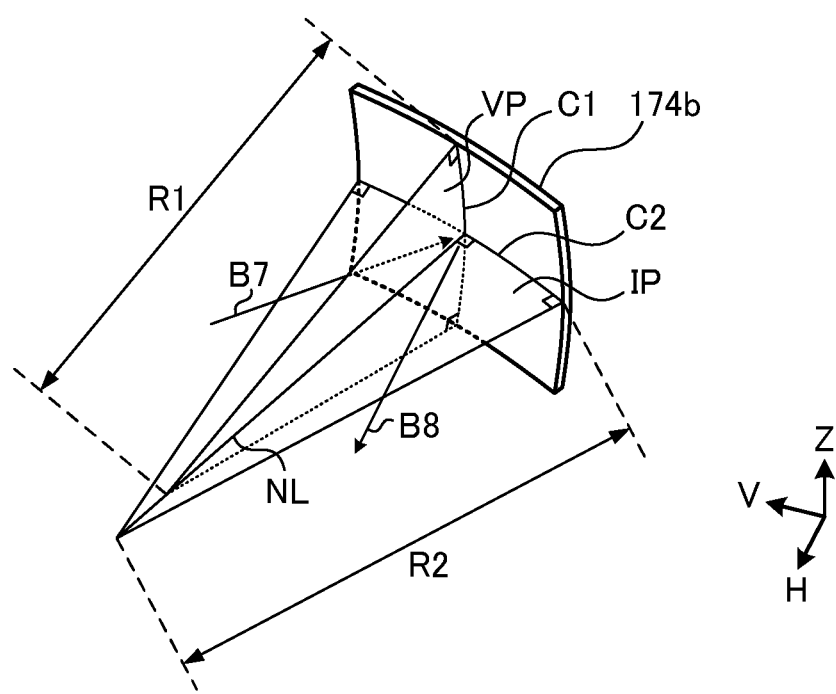
FIG. 8E shows an optical axis of the pulse laser light incident on a concave toroidal mirror of the third embodiment and an optical axis of the pulse laser light reflected by the concave toroidal mirror.

FIG. 8E shows an optical axis of the pulse laser light B7 incident on the concave toroidal mirror 174b and an optical axis of the pulse laser light B8 reflected by the concave toroidal mirror 174b.

As shown in FIG. 8E, a plane being perpendicular to the incident plane IP of the pulse laser light B7 and including the normal line NL of the concave toroidal mirror 174b is defined as a vertical plane VP. The first radius of curvature of the concave toroidal mirror 174b along the vertical plane VP is defined as R1, and the second radius of curvature of the concave toroidal mirror 174b along the incident plane IP is defined as R2.

The first radius of curvature R1 of the concave toroidal mirror 174b along the vertical plane VP corresponds to a radius of curvature of a curve C1 drawn on the surface of the concave toroidal mirror 174b along the vertical plane VP. The second radius of curvature R2 of the concave toroidal mirror 174b along the incident plane IP corresponds to a radius of curvature of a curve C2 drawn on the surface of the concave toroidal mirror 174b along the incident plane IP.

When light is obliquely incident on a spherical mirror, the convergence position of the light in the incident surface is close to the mirror and is shifted from the convergence position of the light in a direction perpendicular to the incident surface, so that astigmatism occurs. Therefore, in the third embodiment, the concave toroidal mirror 174b has the second radius of curvature R2 along the incident plane IP larger than the first radius of curvature R1 along the vertical plane VP, so that astigmatism is reduced.

Each of the concave toroidal mirrors 171b to 173b is also a toroidal mirror whose second radius of curvature R2 along the incident plane IP is larger than the first radius of curvature R1 along a vertical plane VP.

The first radius of curvature R1 along the vertical plane VP is, for example, 78.5 mm.

The second radius of curvature R2 along the incident plane IP is, for example, 88.5 mm.

The pulse laser light B5 reflected by the concave toroidal mirror 171b is concentrated in both of the longitudinal direction and the short-length direction of the beam cross section, and then is incident on the concave toroidal mirror 172b while spreading in both of the longitudinal direction and the short-length direction of the beam cross section. The pulse laser light B7 reflected by the concave toroidal mirror 173b is also concentrated in both of the longitudinal direction and the short-length direction of the beam cross section, and then is incident on the concave toroidal mirror 174b while spreading in both of the longitudinal direction and the short-length direction of the beam cross section.

The concave toroidal mirror 172b and the concave toroidal mirror 174b collimate the pulse laser light B5, B7 having passed through the concentration position and incident thereon while spreading in both of the longitudinal direction and the short-length direction of the beam cross section by reflecting them as the pulse laser light B6, B8, respectively.

The concave toroidal mirror 171b or 173b corresponds to the first concave toroidal mirror in the present disclosure, and the concave toroidal mirror 172b or 174b corresponds to the second concave toroidal mirror in the present disclosure.

In other respects, the configuration and operation of the first optical pulse stretcher 17b are similar to those of the first optical pulse stretcher 17 of the first embodiment.

4.2 Effect of First Optical Pulse Stretcher

In the third embodiment as well, since the pulse laser light passes through the first delay optical system to reduce the spatial coherence, the speckle contrast can be reduced.

Further, since the optical path length of the delay optical path is short, the first optical pulse stretcher 17b can be made compact.

According to the third embodiment, since the concave toroidal mirrors 171b to 174b are used, even when the optical path length of the delay optical path is short and the incident angle θ1 is large, the occurrence of astigmatism is suppressed.

Further, since the delay optical path is configured by the transfer optical system and imaging is performed in both of the longitudinal direction and the short-length direction of the beam cross section, the beam spread of the output pulse laser light B10 in the longitudinal direction and the short-length direction of the beam cross section is reduced. Therefore, energy loss is reduced.

4.3 Configuration and Operation of Second Optical Pulse Stretcher

Figure 9A:
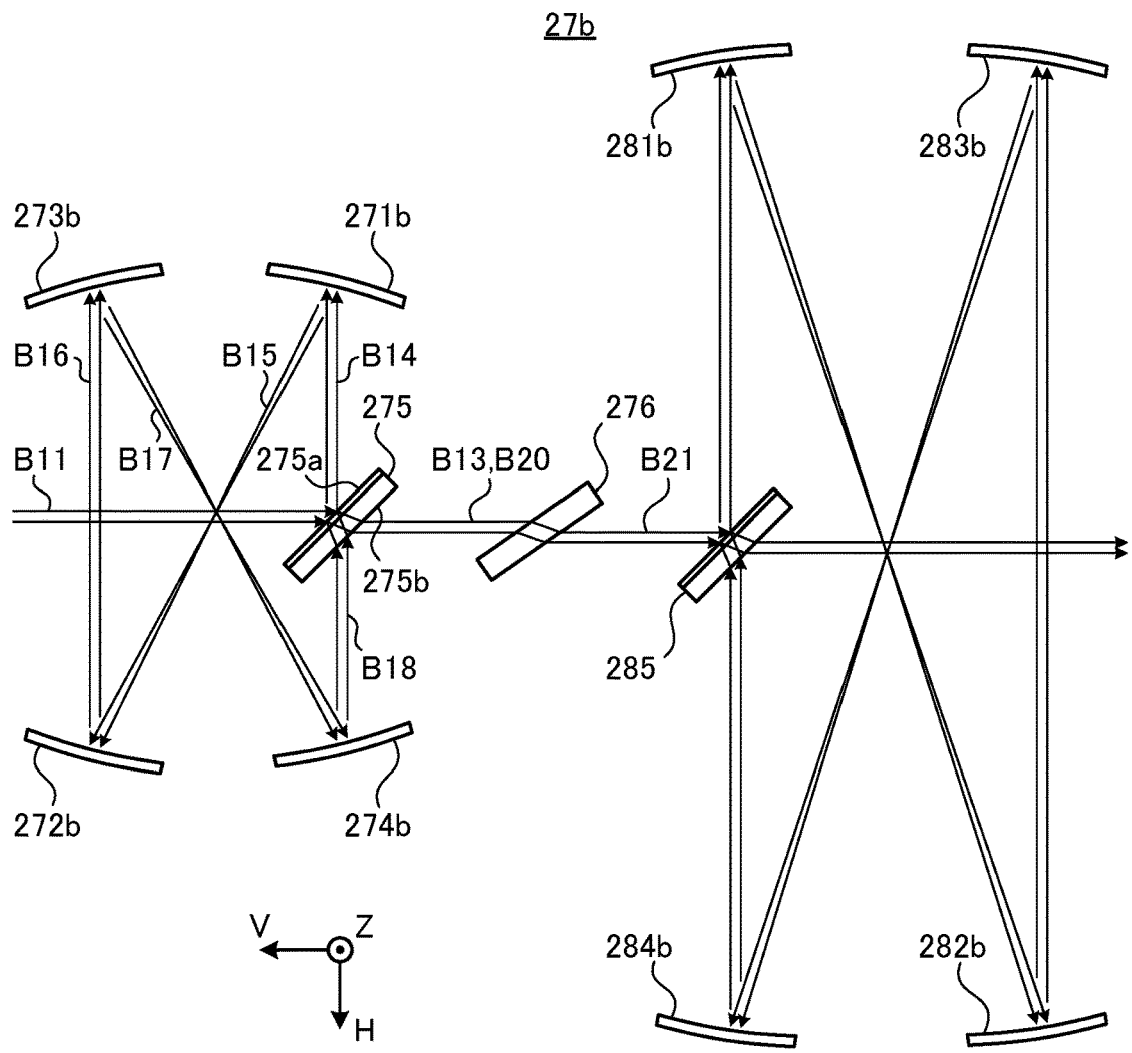
FIG. 9A is a view of the second optical pulse stretcher of the third embodiment viewed in the −Z direction.
Figure 9B:
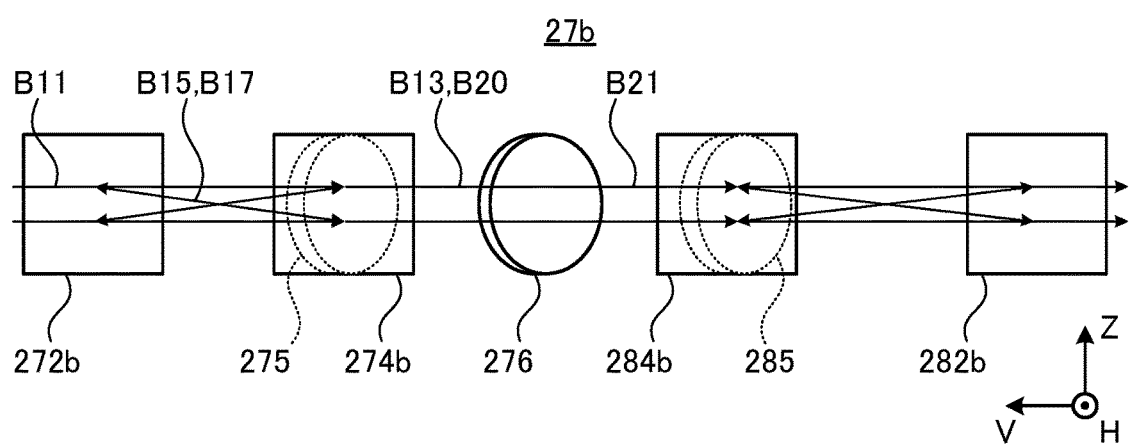
FIG. 9B is a view of the second optical pulse stretcher of the third embodiment viewed in the −H direction.

FIG. 9A is a view of a second optical pulse stretcher 27b of a third embodiment viewed in the −Z direction. FIG. 9B is a view of the second optical pulse stretcher 27b viewed in the −H direction.

The second optical pulse stretcher 27b includes a second delay optical system including four concave toroidal mirrors 271b to 274b, and a third delay optical system including another four concave toroidal mirrors 281b to 284b.

Each of the concave toroidal mirrors 271b to 274b and 281b to 284b is a toroidal mirror whose second radius of curvature R2 along the incident plane IP is larger than the first radius of curvature R1 along the vertical plane VP.

Therefore, the concave toroidal mirrors 271b, 273b, 281b, 283b concentrate the pulse laser light in both of the longitudinal direction and the short-length direction of the beam cross section and the concave toroidal mirrors 272b, 274b, 282b, 284b collimate the pulse laser light, respectively, thereby reducing spatial coherence.

The first radius of curvature R1 of each of the concave toroidal mirrors 271b to 274b along the vertical plane VP is, for example, 156.5 mm. The second radius of curvature R2 of each of the concave toroidal mirrors 271b to 274b along the incident plane IP is, for example, 168.6 mm.

The first radius of curvature R1 of each of the concave toroidal mirrors 281b to 284b along the vertical plane VP is, for example, 303.4 mm. The second radius of curvature R2 of each of the concave toroidal mirrors 281b to 284b along the incident plane IP is, for example, 314.4 mm.

In other respects, the configuration and operation of the second optical pulse stretcher 27b are similar to those of the second optical pulse stretcher 27 of the first embodiment.

4.4 Effect of Second Optical Pulse Stretcher

Also in the third embodiment as well, the second optical pulse stretcher 27b can reduce the speckle contrast by the same effect as the first optical pulse stretcher 17b. Since the optical path lengths of the first, second, and third delay optical systems are different from each other, it is possible to prevent a part of light delayed by one delay optical system from returning to the original state by another delay optical system. Therefore, in addition to the effect of reducing the speckle contrast by the first optical pulse stretcher 17b, the speckle contrast can be further reduced by the second optical pulse stretcher 27b.

5. Optical Pulse Stretcher Capable of Changing Output Beam Position

5.1 Schematic Configuration

FIG. 10 schematically shows the configuration of the laser device of a fourth embodiment of the present disclosure. In the fourth embodiment, a first optical pulse stretcher 17c arranged between the master oscillator MO and the amplifier PO is configured to be capable of adjusting the posture of the plane-parallel plate 176. The laser device of the fourth embodiment also includes a laser controller 30, a beam divergence measurement instrument 31, and a beam pointing measurement instrument 32.

The beam divergence measurement instrument 31 includes a beam splitter 31a, a light concentrating optical system 31b, and an image sensor 31c. A light receiving surface of the image sensor 31c is arranged in a focal position of the light concentrating optical system 31b.

The beam pointing measurement instrument 32 includes a beam splitter 32a, a transfer optical system 32b, and an image sensor 32c. A light receiving surface of the image sensor 32c is arranged at a position where the optical intensity distribution of the beam cross section at a predetermined position of the pulse laser light is imaged by the transfer optical system 32b.

5.2 Configuration of First Optical Pulse Stretcher

Figure 11:
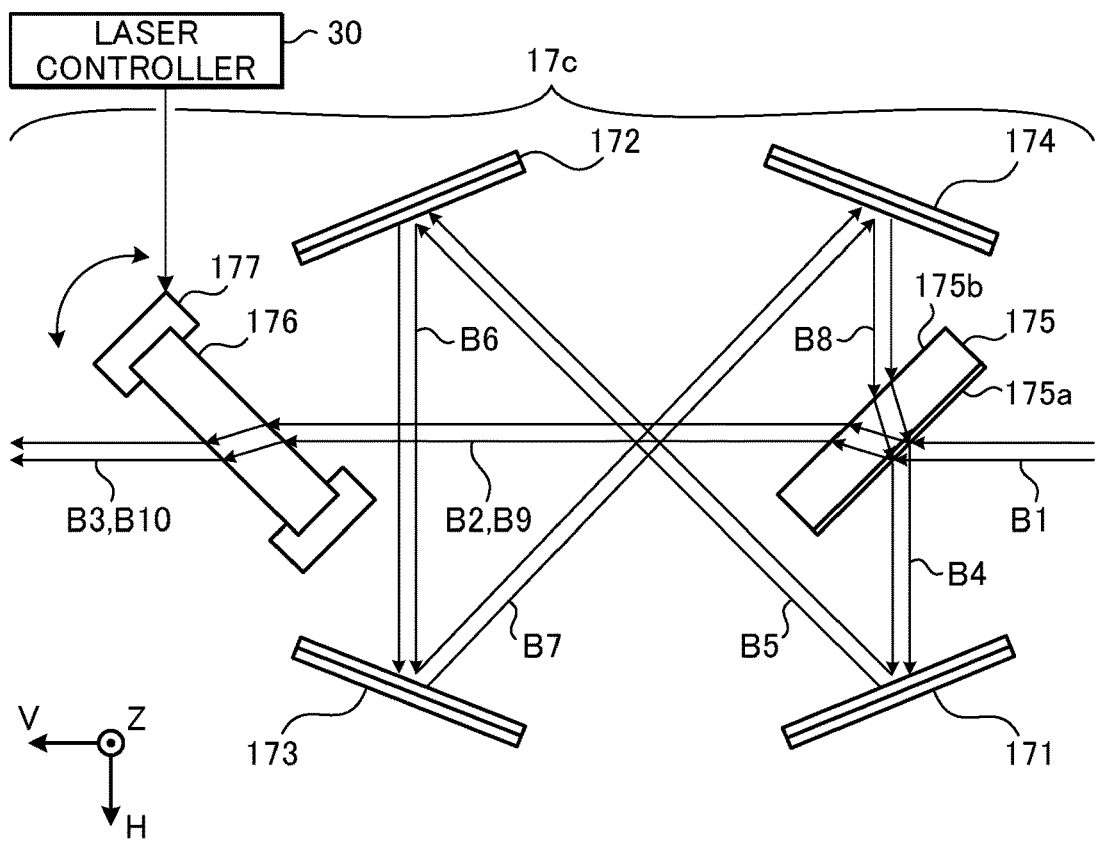
FIG. 11 is a view of the first optical pulse stretcher of the fourth embodiment viewed in the −Z direction.

FIG. 11 is a view of the first optical pulse stretcher 17c viewed in the −Z direction. In the fourth embodiment, an actuator 177 is attached to the plane-parallel plate 176.

In other respects, the configuration of the fourth embodiment is similar to that of the first embodiment. Alternatively, in other respects, the configuration of the fourth embodiment may be similar to that of the second or third embodiment.

5.3 Operation

The laser controller 30 calculates a spot diameter of the pulse laser light from an image data of the image sensor 31c, and calculates the beam divergence of the pulse laser light based on the spot diameter.

The laser controller 30 calculates a center position of the optical intensity distribution of the beam cross section from the image data of the image sensor 32c, and calculates the beam pointing of the pulse laser light based on the center position.

The laser controller 30 controls the actuator 177 based on the beam divergence and the beam pointing of the pulse laser light. Thus, the posture of the plane-parallel plate 176 is adjusted and the beam position of the pulse laser light incident on the amplifier PO is adjusted.

In other respects, the operation of the fourth embodiment is similar to that of any of the first to third embodiments.

5.4 Effect

According to the fourth embodiment, the beam position of the pulse laser light incident on the amplifier PO can be optimized based on the beam divergence and the beam pointing of the pulse laser light output from the laser device. Thus, the dose stability, the beam divergence, the beam pointing, and the like of the pulse laser light can be optimized.

6. Others

Figure 12:
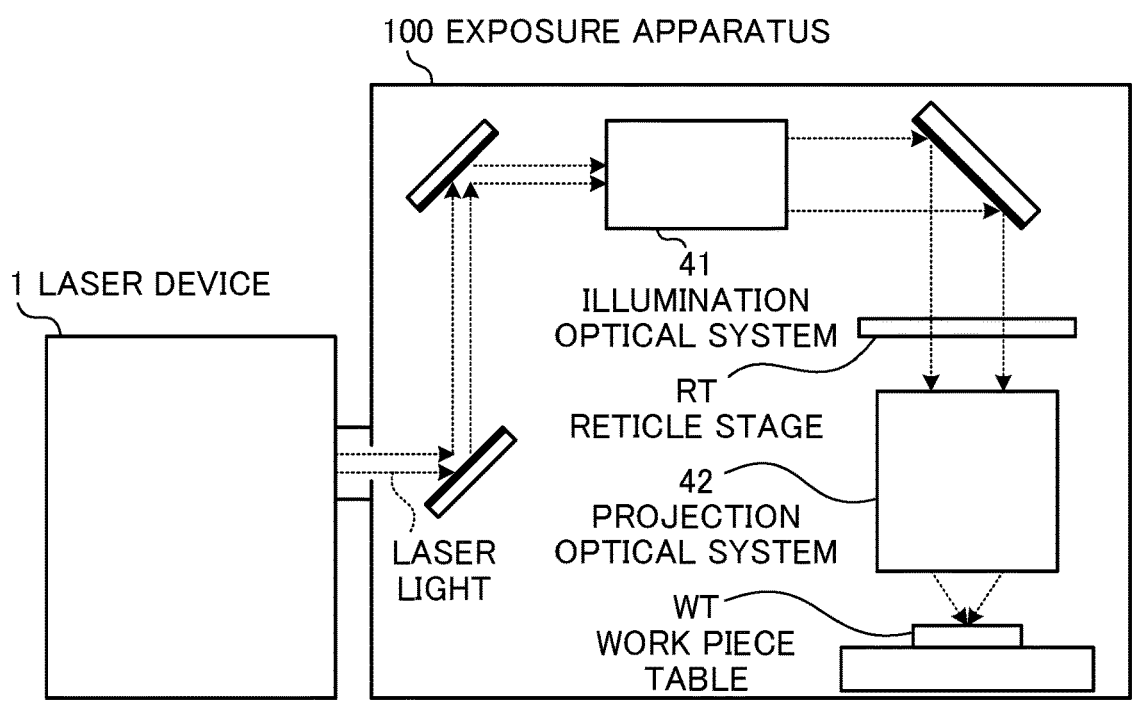
FIG. 12 schematically shows the configuration of an exposure apparatus connected to the laser device.

FIG. 12 schematically shows the configuration of an exposure apparatus 100 connected to a laser device 1. The laser device 1 generates pulse laser light and outputs the pulse laser light to the exposure apparatus 100.

In FIG. 12, the exposure apparatus 100 includes an illumination optical system 41 and a projection optical system 42. The illumination optical system 41 illuminates a reticle pattern of a reticle stage RT with the pulse laser light incident from the laser device 1. The projection optical system 42 causes the pulse laser light transmitted through the reticle to be imaged as being reduced and projected on a workpiece (not shown) arranged on a workpiece table WT. The workpiece is a photosensitive substrate such as a semiconductor wafer on which photoresist is applied. The exposure apparatus 100 synchronously translates the reticle stage RT and the workpiece table WT to expose the workpiece to the pulse laser light reflecting the reticle pattern. Through the exposure process as described above, a device pattern is transferred onto the semiconductor wafer, thereby an electronic device can be manufactured.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that embodiments of the present disclosure would be appropriately combined.

The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. A laser device, comprising:
   a master oscillator configured to output pulse laser light;
   a first optical pulse stretcher which includes a first delay optical system including a plurality of concave toroidal mirrors, and a beam splitter including a first surface and a second surface, causing a part of pulse laser light incident on the first surface to be transmitted in a first direction and output as a first beam and another part thereof to be reflected in a second direction and enter the first delay optical system, and causing a part of pulse laser light incident on the second surface from the first delay optical system to be reflected in the first direction and output as a second beam, and which is arranged on an optical path of pulse laser light output from the master oscillator; and
   a second optical pulse stretcher arranged on an optical path of pulse laser light output from the master oscillator,
   wherein the second optical pulse stretcher includes a second delay optical system including a plurality of concave toroidal mirrors, and a beam splitter including a third surface and a fourth surface, causing a part of pulse laser light incident on the third surface to be transmitted in a third direction and output as a first beam and another part thereof to be reflected in a fourth direction and enter the second delay optical system, and causing a part of pulse laser light incident on the fourth surface from the second delay optical system to be reflected in the third direction and output as a second beam, and
   an optical path length of a delay optical path configured by the first delay optical system is different from an optical path length of a delay optical path configured by the second delay optical system.

2. The laser device according to claim 1,
   wherein the plurality of concave toroidal mirrors include a first concave cylindrical mirror and a second concave cylindrical mirror,
   the first concave cylindrical mirror concentrates pulse laser light output from the master oscillator in a longitudinal direction of a beam cross section of the pulse laser light, and
   the second concave cylindrical mirror collimates pulse laser light having passed through a concentration position concentrated by the first concave cylindrical mirror.

3. The laser device according to claim 1,
   wherein the plurality of concave toroidal mirrors include a first concave cylindrical mirror and a second concave cylindrical mirror,
   the first concave cylindrical mirror concentrates pulse laser light output from the master oscillator in a direction perpendicular to a longitudinal direction of a beam cross section of the pulse laser light, and
   the second concave cylindrical mirror collimates pulse laser light having passed through a concentration position concentrated by the first concave cylindrical mirror.

4. The laser device according to claim 1,
   wherein the plurality of concave toroidal mirrors include a first concave toroidal mirror and a second concave toroidal mirror,
   the first concave toroidal mirror concentrates pulse laser light output from the master oscillator in both of a longitudinal direction of a beam cross section of the pulse laser light and a direction perpendicular to the longitudinal direction, and
   the second concave toroidal mirror collimates pulse laser light having passed through a concentration position concentrated by the first concave toroidal mirror.

5. The laser device according to claim 1,
   wherein pulse laser light output from the master oscillator is incident on each of the plurality of concave toroidal mirrors as being inclined with respect to a longitudinal direction of a beam cross section perpendicular to an optical axis of the pulse laser light.

6. The laser device according to claim 1, further comprising an amplifier arranged on an optical path of pulse laser light output from the master oscillator,
wherein the first optical pulse stretcher is arranged between the master oscillator and the amplifier.

7. The laser device according to claim 1,
wherein the optical path length of the delay optical path configured by the first delay optical system is shorter than the optical path length of the delay optical path configured by the second delay optical system.

8. The laser device according to claim 1,
wherein the first optical pulse stretcher further includes an optical element which compensates for deviation of an optical axis of pulse laser light occurring when the part of the pulse laser light incident on the first surface is transmitted through the beam splitter.

9. The laser device according to claim 8, further comprising:
a measurement instrument configured to measure beam pointing and beam divergence of pulse laser light having passed through the first optical pulse stretcher; and
an actuator configured to adjust posture of the optical element based on an output of the measurement instrument.

10. The laser device according to claim 9, further comprising an amplifier arranged on an optical path of pulse laser light output from the master oscillator,
wherein the first optical pulse stretcher is arranged between the master oscillator and the amplifier.

11. An electronic device manufacturing method, comprising:
generating pulse laser light using a laser device;
emitting the pulse laser light to an exposure apparatus; and
exposing a photosensitive substrate to the pulse laser light in the exposure apparatus to manufacture an electronic device,
the laser device including:
a master oscillator configured to output pulse laser light;
a first optical pulse stretcher which includes a first delay optical system including a plurality of concave toroidal mirrors, and a beam splitter including a first surface and a second surface, causing a part of pulse laser light incident on the first surface to be transmitted in a first direction and output as a first beam and another part thereof to be reflected in a second direction and enter the first delay optical system, and causing a part of pulse laser light incident on the second surface from the first delay optical system to be reflected in the first direction and output as a second beam, and which is arranged on an optical path of pulse laser light output from the master oscillator; and
a second optical pulse stretcher arranged on an optical path of pulse laser light output from the master oscillator
wherein the second optical pulse stretcher includes a second delay optical system including a plurality of concave toroidal mirrors, and a beam splitter including a third surface and a fourth surface, causing a part of pulse laser light incident on the third surface to be transmitted in a third direction and output as a first beam and another part thereof to be reflected in a fourth direction and enter the second delay optical system, and causing a part of pulse laser light incident on the fourth surface from the second delay optical system to be reflected in the third direction and output as a second beam, and
an optical path length of a delay optical path configured by the first delay optical system is different from an optical path length of a delay optical path configured by the second delay optical system.

12. The laser device according to claim 6,
wherein the second optical pulse stretcher is arranged on an optical path of pulse laser light output from the amplifier.

* * * * *